United States Patent [19]
Sugiyama et al.

[11] Patent Number: 5,787,268
[45] Date of Patent: Jul. 28, 1998

[54] INTERACTIVE CIRCUIT DESIGNING APPARATUS

[75] Inventors: Yaroku Sugiyama; Hiroyuki Sugiyama; Noriyuki Ito; Ryouichi Yamashita; Terunobu Maruyama; Yasunori Abe, all of Kawasaki, Japan

[73] Assignee: Fujitsu Limited, Kawasaki, Japan

[21] Appl. No.: 497,375

[22] Filed: Jun. 30, 1995

[30] Foreign Application Priority Data

Oct. 20, 1994 [JP] Japan .................. 6-255783

[51] Int. Cl.⁶ ........................................ G06F 17/50
[52] U.S. Cl. ........................ 395/500; 364/489; 364/490; 371/24
[58] Field of Search ........................ 364/489, 490, 364/491; 395/500; 371/24, 25.1, 27

[56] References Cited

U.S. PATENT DOCUMENTS

| | | | |
|---|---|---|---|
| 4,896,272 | 1/1990 | Kurosawa | 364/491 |
| 5,495,419 | 2/1996 | Rostoker | 364/468 |
| 5,526,517 | 6/1996 | Jones et al. | 395/600 |
| 5,535,223 | 7/1996 | Horstmann et al. | 371/27 |
| 5,555,201 | 9/1996 | Dangelo et al. | 364/489 |
| 5,572,437 | 11/1996 | Rostoker et al. | 364/489 |

FOREIGN PATENT DOCUMENTS

| | | |
|---|---|---|
| 2-228716 | 9/1990 | Japan . |
| 2-231646 | 9/1990 | Japan . |
| 4-111400 | 4/1992 | Japan . |
| 4-373076 | 12/1992 | Japan . |

*Primary Examiner*—Kevin J. Teska
*Assistant Examiner*—Thai Phan
*Attorney, Agent, or Firm*—Staas & Halsey

[57] ABSTRACT

The invention provides an interactive circuit designing apparatus wherein a logic design, a layout design and a speed analysis can cooperate with each other in processing. The interactive circuit designing apparatus comprises a logical designing section for logically designing a design object circuit, a layout designing section for performing mounting arrangement of logical components constituting a design object circuit based on a result of the logical design and performing wiring between the logical components, and a speed analysis section for performing a speed analysis based on calculation of a delay for each of paths on the design object circuit in accordance with a result of the layout. The logical designing section, the layout designing section and the speed analysis section are connected to each other so as to cooperate with each other when necessary. The interactive circuit designing apparatus is applied to an apparatus for designing a circuit of an LSI, a printed circuit board or a like element.

69 Claims, 22 Drawing Sheets

▨ ---- CELL ARRANGED

▨ ---- ORIGIN OF AREA   ▦ ---- CELL ARRANGED

▨,▦ ---- CELL ARRANGED

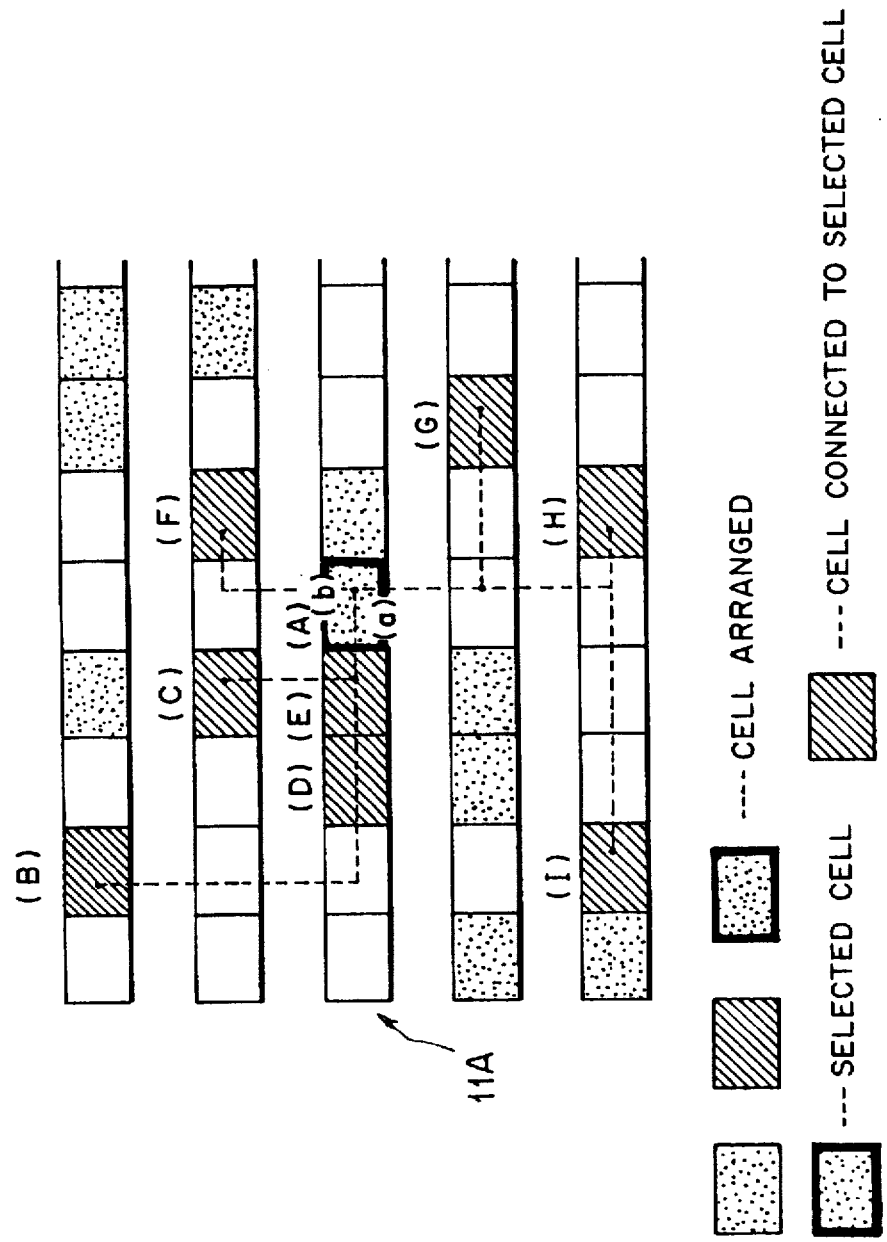

FIG. 21(a)   FIG. 21(b)
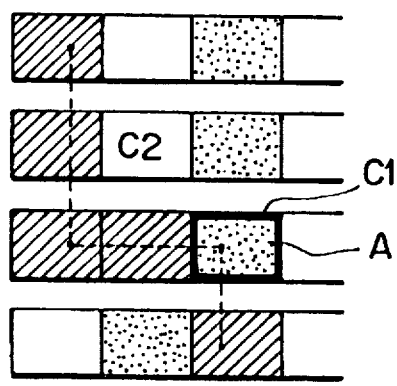 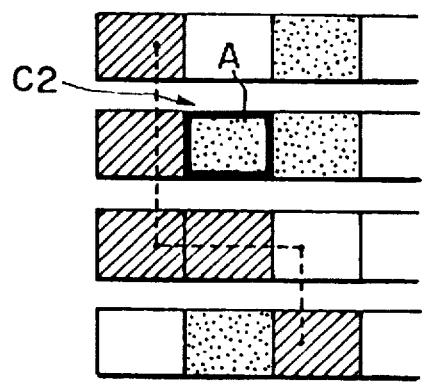
FIG. 22
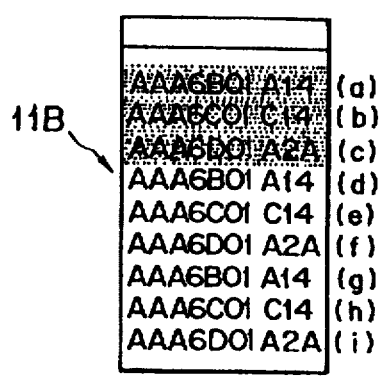

FIG. 23
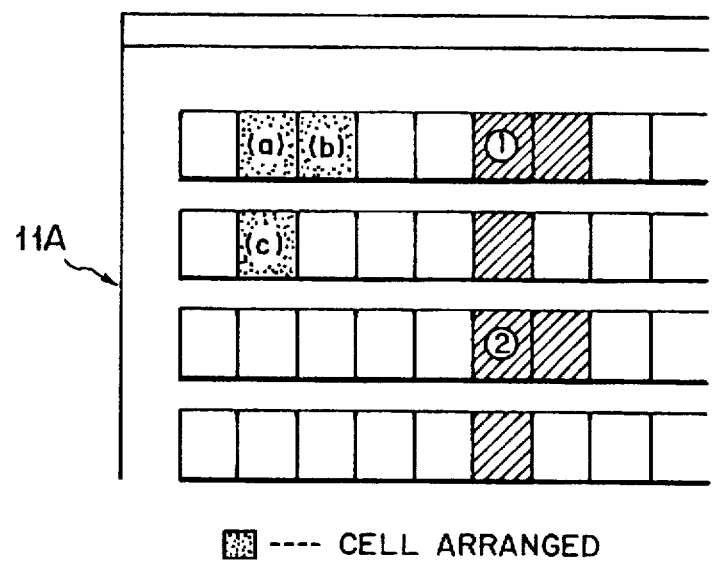
▨ ---- CELL ARRANGED
FIG. 24
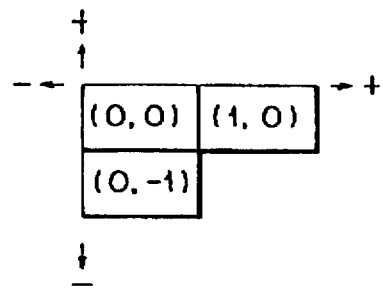
FIG. 25
| COORDINATES (0,0) |
| COORDINATES (1,0) |
| COORDINATES (0,-1) |

FIG. 26(a)
FIG. 26(b)
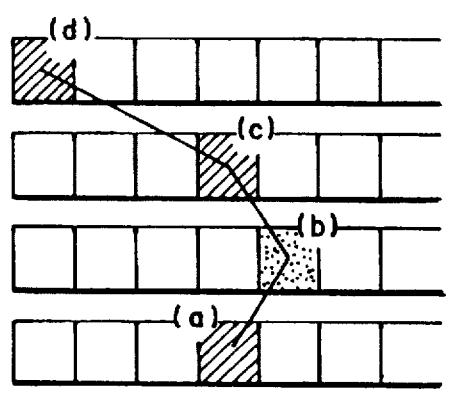
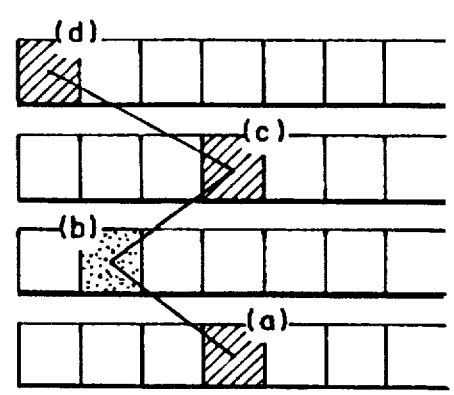

EXAMPLE OF PATH ROUTE MAP

*1: DELAY OF NETWORK
*2: DELAY OF GATE
*3: ACCUMULATED DELAY AT PINS FROM SOURCE PIN
   (UP SIDE)
*4: ACCUMULATED DELAY AT PINS FROM SOURCE PIN
   (DOWN SIDE)
*5: FAN-IN NUMBER OF NETWORK
*6: FAN-OUT NUMBER OF NETWORK
*7: TRANSITION OF WAVEFORM
*8: LINE LENGTH OF NETWORK
   (LINE LENGTH BETWEEN DRIVER & RECEIVER/
   TOTAL LINE LENGTH)

INTERACTIVE CIRCUIT DESIGNING APPARATUS

BACKGROUND OF THE INVENTION

1. Field of the Invention

This invention relates to an interactive circuit designing apparatus wherein a logic design, a layout design and a speed analysis are performed in order to design a circuit of an LSI, a printed circuit board or a like element.

2. Description of the Related Art

Usually, in order to design a circuit of an LSI, a printed circuit board or a like element, a logic design, a layout design (mounting design) and a speed analysis are performed.

In particular, referring to FIG. 30, a logic design for realizing a function required for a design object circuit is performed first (step A1), and then, a layout design is performed wherein a mounting (physical) arrangement of cells such as flip-flops as logical components and a wiring scheme between the cells are determined based on a result of the logic design (step A2).

After the layout design, a speed analysis is performed by delay calculation for each of paths obtained as a result of the layout design (step A3). The magnitudes of the delay obtained as a result of the analysis are fed back to perform another logic design and another layout design at steps A1 and A2 in order to improve the delay of each path. Thus, the operations at steps A1 to A3 are repeated in a trial-end-error fashion until an optimum delay is obtained for each path.

The logic design, the layout design and the speed analysis at the steps described above are conventionally performed by separate systems (software) including an interactive logic design system, an interactive layout design system and an interactive speed analysis system, and those systems exist separately from each other and do not cooperate with each other in processing. Consequently, in the prior art system configuration, a circuit design is performed by sequential processing including feedback as described above with reference to FIG. 30.

However, with the conventional circuit design technique described above, since a logic design, a layout design and a speed analysis are performed by separate systems (software) from each other and do not cooperate with each other, processes must be performed sequentially and repetitively. Consequently, the conventional circuit design technique has a subject to be solved in that a long turn-around time is involved and a circuit of an LSI, a printed circuit board or a like element cannot be designed and developed rapidly.

Particularly, since a logic design and a layout design are conventionally performed independently of each other, it is difficult to proceed with a logic design of a clock distribution circuit, a diagnosis facilitation circuit (testing circuit or scan checking circuit), a reset distribution circuit or a like circuit, whose logic circuit configuration varies in accordance with a result of a layout design, and a layout design of another circuit to which any of such circuits as mentioned above is to be added. This also makes a factor of obstructing an increase in speed of a circuit design.

SUMMARY OF THE INVENTION

It is an object of the present invention to provide an interactive circuit designing apparatus wherein a logic design, a layout design and a speed analysis can cooperate with each other in processing to perform a circuit design of an LSI, a printed circuit or a like element rapidly.

In order to attain the object described above, according to the present invention, there is provided an interactive circuit designing apparatus, comprising a display section for displaying a process of a circuit design to allow a circuit design to be performed interactively, an inputting section for inputting response information to display data displayed on the display section, logical designing means for logically designing a design object circuit, layout designing means for performing mounting arrangement of logical components constituting the design object circuit based on a result of the logical design by the logical designing means and performing wiring between the logical components, and speed analysis means for performing a speed analysis based on calculation of a delay for each of paths on the design object circuit in accordance with a result of the design by the layout designing means, the logical designing means, the layout designing means and the speed analysis means being connected to each other so as to cooperate with each other when necessary.

With the interactive circuit designing apparatus, since the logical designing means, the layout designing means and the speed analysis means cooperate with each other in one system to perform a circuit design, there is an advantage in that the turn-around time can be reduced to raise the speed of a circuit design of an LSI, a printed circuit board or a like element remarkably.

Further objects, features and advantages of the present invention will become apparent from the following detailed description when read in conjunction with the accompanying drawings in which like parts or elements are denoted by like reference characters.

BRIEF DESCRIPTION OF THE DRAWINGS

FIG. 20 is a diagrammatic view showing an example of a display on an arrangement map upon retrieval of arrangement information;

FIGS. 21(a) and 21(b) are diagrammatic views illustrating an example of movement of a cell in a network displaying condition;

FIG. 22 is a diagrammatic view showing an example of a display of a cell list and illustrating a catalogue arrangement;

FIG. 23 is a diagrammatic view illustrating a catalogue arrangement;

FIG. 24 is a diagrammatic view illustrating relative coordinates of cells upon processing of a catalogue arrangement;

FIG. 25 is a diagrammatic view illustrating position data of cells upon processing of a catalogue arrangement;

FIGS. 26(a) and 26(b) are diagrammatic views illustrating an example of re-calculation of a delay upon movement of a cell;

DESCRIPTION OF THE PREFERRED EMBODIMENT a. Aspect of the Invention

Figure 1:
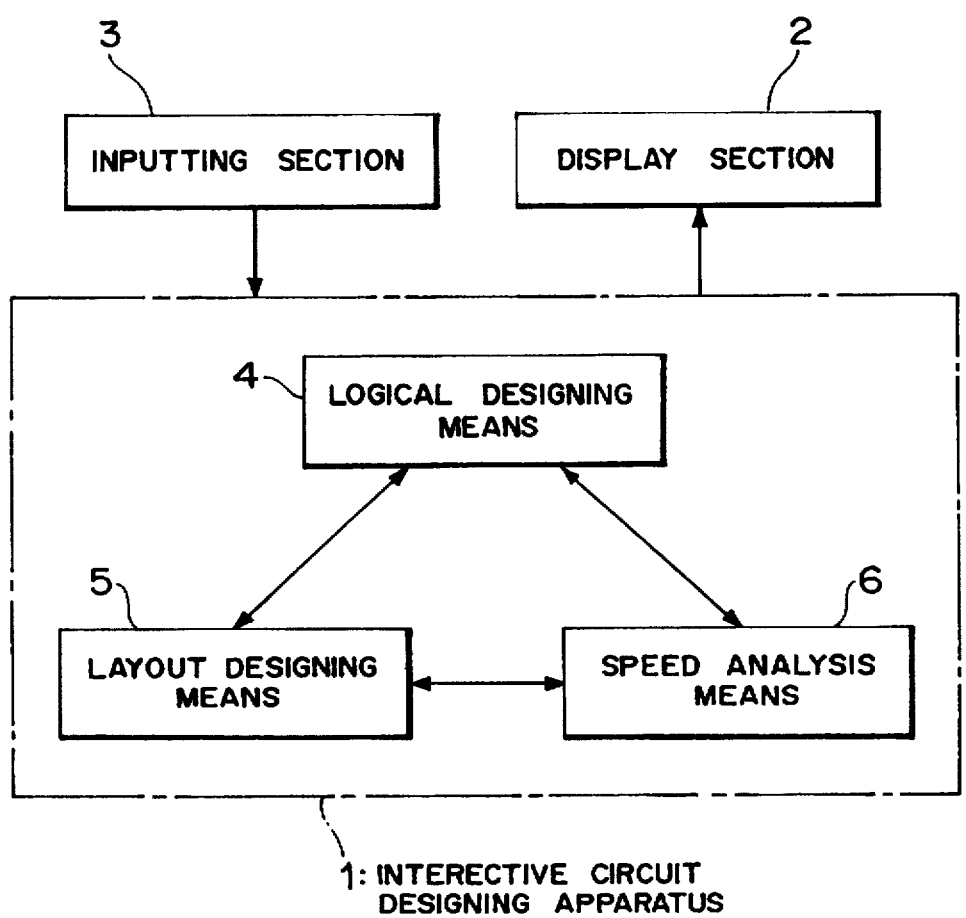
FIG. 1 is a block diagram illustrating an aspect of the present invention.

Referring first to FIG. 1, there is shown in block diagram an interactive circuit designing apparatus according to th e aspect of the present invention. The interactive circuit designing apparatus includes an apparatus body 1 for which a display section 2 for displaying a process of a circuit design to allow a circuit design to be performed interactively and an inputting section 3 for inputting response information to display data displayed on the display section 2 are provided.

Th e apparatus body 1 includes logical designing means 4, layout designing means 5 and speed analysis means 6.

The logical designing means 4 logically designs a design object circuit. The layout designing means 5 performs mounting arrangement of logical components constituting a design object circuit based on a result of a logical design by th e logical designing means 4 and then performs wiring between the logical components. The speed analysis means 6 performs a speed analysis based on calculation of a delay for each of paths on a design object circuit in accordance with a result of a design by the layout designing means 5.

In the interactive circuit designing apparatus, the logical designing means 4, the layout designing means 5 and the speed analysis means 6 are connected to each other so as to cooperate with each other when necessary.

The interactive circuit designing apparatus may be constructed such that it further includes a grouping section for grouping, after a plurality of logical components to which a predetermined signal is to be distributed are arranged for mounting by the layout designing means 5, the plurality of logical components for last stage temporary positions of a signal distribution circuit for distributing the signal, and that the logical designing means 4 includes a logic circuit addition section for generating a signal distribution circuit for distributing a signal from a signal source to the individual logical components based on the last stage temporary positions and the plurality of logical component groups obtained by grouping by the grouping section and adding the signal distribution circuit as a logic circuit, the layout designing means 5 determining a mounting arrangement of the signal distribution circuit based on the logic circuit as the signal distribution circuit added by the logic circuit addition section.

In this instance, the last stage temporary positions and the plurality of logical component groups obtained by grouping by the grouping section may be displayed on the display section 2, and estimated wiring line lengths from the last stage temporary positions to the individual logical components may be displayed on the display section 2.

Also, the interactive circuit designing apparatus may further include a grouping variation acceptance section for accepting a request for variation of the grouping inputted from the inputting section 3 in response to the display of the display section 2 and requesting the grouping section for variation of the grouping, a signal distribution circuit last stage arrangement variation acceptance section for accepting a request for variation of the last stage temporary positions inputted from the inputting section 3 in response to the display of the display section 2 and developing a request for variation of the last stage temporary positions, or a logical component arrangement variation acceptance section for accepting a request for variation of an arrangement position of a logical component inputted from the inputting section 3 in response to the display of the display section 2 and requesting the layout designing means 5 for variation of the arrangement position of the logical component.

The signal distribution circuit added by the logic circuit addition section may be displayed on the display section 2. In this instance, the interactive circuit designing apparatus may further include an additional circuit variation acceptance section for accepting a request for variation of the signal distribution circuit inputted from the inputting section 3 in response to the display of the display section 2 and requesting the logic circuit addition section for variation of the signal distribution circuit.

The predetermined signal distributed to the logical components by the signal distribution circuit may be a clock signal or a reset signal.

Meanwhile, the interactive circuit designing apparatus may be constructed such that the logical designing means 4 includes a construction information decision section for deciding, after a plurality of logical components to be diagnosed are arranged for mounting by the layout designing means 5, construction information of a diagnosis facilitation circuit for diagnosing the plurality of logical components based on a result of arrangement of the plurality of logical components, and the layout designing means 5 performs mounting arrangement of the diagnosis facilitation circuit based on the construction information of the diagnosis facilitation circuit decided by the construction information decision section.

In this instance, the construction information of the diagnosis facilitation circuit decided by the construction information decision section may be displayed on the display section 2. Here, the interactive circuit designing apparatus may further include a construction information variation acceptance section for accepting a request for variation of the construction information inputted from the inputting section 3 in response to the display of the display section 2 and requesting the construction information decision section for variation of the construction information.

Further, where the diagnosis facilitation circuit is of the scan chain type, the construction information decision section may decide a connection order of the plurality of logical components as the construction information for constructing a scan chain. However, where the diagnosis facilitation circuit is of the address scan type, the construction information decision section may decide addresses for scanning the logical components as the construction information.

The interactive circuit designing apparatus may further include a temporary wiring line production section for imaginatively wiring, after a mounting arrangement of the logical components is decided by the layout designing means 5, the logical components, and a confusion degree calculation section for calculating a confusion degree of wiring lines on the design object circuit based on a result of the temporary wiring by the temporary wiring line production section, the confusion degree calculated by the confusion degree calculation section being displayed on the display section 2.

In this instance, the confusion degree calculation section may divide the design object circuit into a plurality of grating-like areas and calculate, for each wiring layer of the design object circuit, a ratio of the number of estimated used channels based on a result of the temporary wiring by the temporary wiring line production section to the number of usable channels in each of the gratings as the confusion degree. Or, the confusion degree calculation section may calculate the number of free channels at a coordinate of each wiring layer in the direction of a main wiring line as the confusion degree.

Or, the interactive circuit designing apparatus may further include a logical component arrangement variation acceptance section for accepting a request for variation of the mounting arrangement of a logical component inputted from the inputting section 3 in response to the display of the display section 2 and requesting the layout designing means 5 for variation of the mounting arrangement. Otherwise, the confusion degree calculation section may calculate, after mounting wiring of the logical components is decided by the layout designing means 5, the confusion degree based on a result of the mounting wiring, the confusion degree calculated by the confusion degree calculation section being displayed on the display section 2.

The interactive circuit designing apparatus may be constructed such that, when a mounting arrangement of the logical components is decided by the layout designing means 5, an arrangement map of the design object circuit on which the logical components are arranged and a logical component list of the logical components to be arranged on the arrangement map are displayed in response to an instruction from the inputting section 3 on the display section 2.

In this instance, the interactive circuit designing apparatus may further include a logical component arrangement section for arranging on the arrangement map a logical component selected on the logical component list in response to an instruction from the inputting section 3. Here, the interactive circuit designing apparatus may further include a logical component deletion section for deleting from the arrangement map a logical component selected on the logical component list or the arrangement map in response to an instruction from the inputting section 3 or a logical component movement section for moving a logical component selected on the logical component list or the arrangement map to another position on the arrangement map in response to an instruction from the inputting section 3. Or, the interactive circuit designing apparatus may further include an information retrieval section for searching individual information or connection information of a logical component selected on the logical component list or the arrangement map in response to an instruction from the inputting section 3 and causing the individual information or connection information thus searched out to be displayed on the display section 2. Here, a connection information list between a selected logical component and all logical components connected to the selected logical component may be displayed as the connection information. In this instance, the connection information list may include logical lengths between the selected logical component and all logical components connected to the selected logical component, and here, when any of the logical lengths violates a predetermined rule, the displaying condition of that portion of the connection information including the logical length which violates the rule may be changed over into a visually identifiable condition on the connection information list. Or else, the interactive circuit designing apparatus may further include a catalogue arrangement section for storing a basic arrangement pattern for arranging a plurality of logical components in a same arrangement as a catalogue and repetitively arranging the basic arrangement pattern on the arrangement map in response to an instruction from the inputting section 3. In this instance, when a plurality of logical components are arranged on the arrangement map by the logical component arrangement section, the logical components may be simultaneously stored as the basic arrangement pattern, or alternatively, a plurality of logical components selected on the arrangement map and arranged already may be stored as the basic arrangement pattern in response to an instruction from the inputting section 3.

The interactive circuit designing apparatus may further includes an external file writing section for writing, during execution of mounting arrangement of the logical components by the layout designing means 5, data of the arrangement in a text form into an external file.

The interactive circuit designing apparatus may be constructed such that, immediately after mounting arrangement processing of the logical components by the layout designing means 5, a speed analysis by the speed analysis means 6 is performed based on a temporary wiring line length between the logical components according to the mounting arrangement, and the mounting arrangement of the logical components is varied in response to a result of the speed analysis by the layout designing means 5.

Or, the interactive circuit designing apparatus may constructed such that, immediately after wiring processing of the logical components by the layout designing means 5, a speed analysis by the speed analysis means 6 is performed based on an actual wiring line length by the wiring, and the wiring of the logical components is varied in response to a result of the speed analysis by the layout designing means 5.

The interactive circuit designing apparatus may further includes a path tracing section for tracing a wiring line path connected to a pin of a logical component designated by an instruction from the inputting section 3 upon execution of a speed analysis by the speed analysis means 6 from the pin, and a path delay display control section for controlling the display section 2 to display thereon a result of a delay calculation of the wiring line path traced by the path tracing section as a path delay list.

In this instance, the interactive circuit designing apparatus may further include a route map display control section for controlling the display section 2 to display thereon a route of a wiring line path designated on the path display list and delays and waveforms at pins on the wiring line path as a route map in response to an instruction from the inputting section 3. Here, the interactive circuit designing apparatus may further include a mounting data display control section for controlling the display section 2 to emphatically display thereon a mounting arrangement condition and a wiring condition of a gate or a network designated on the route map in response to an instruction from the inputting section 3.

The interactive circuit designing apparatus may further include a wiring line parasitic capacitance coding section for coding, upon wiring processing between the logical components by the layout designing means 5, wiring line parasitic capacitances on the design object circuit according to an arrangement and a wiring scheme decided by the layout designing means 5 at present, and a wiring line parasitic capacitance code display control section for controlling the display section 2 to display thereon code information obtained by coding by the wiring line parasitic capacitance coding section in a superimposed relationship on the arrangement map of the design object circuit on the display section 2.

In the interactive circuit designing apparatus of the present invention described above with reference to FIG. 1, when the logical designing means 4, the layout designing means 5 and the speed analysis means 6 are performing their individual processing, some other means in the interactive circuit designing apparatus can be rendered operative to perform its processing.

If a plurality of logical components to which a predetermined signal (clock signal or reset signal) is to be distributed are arranged for mounting by the layout designing means 5, then the grouping section groups the plurality of logical components for last stage temporary positions of a signal distribution circuit. Then, the logic circuit addition section generates a signal distribution circuit for distributing a signal from a signal source to the individual logical components based on the last stage temporary positions and the plurality of logical component groups obtained by grouping by the grouping section and adds the signal distribution circuit as a logic circuit. Thereafter, the layout designing means 5 decides a mounting arrangement of the logical components constituting the signal distribution circuit based on the logic circuit as the signal distribution circuit added by the logic circuit addition section. Since the logical designing means 4 (logic circuit addition section) and the layout designing means 5 cooperate with each other in this manner, a mounting arrangement of a signal distribution circuit for distributing a clock signal, a reset signal or some other signal can be decided in a short time.

In this instance, where the last stage temporary positions and the plurality of logical component groups obtained by grouping by the grouping section, estimated wiring line lengths from the last stage temporary positions to the individual logical components, or the signal distribution circuit added by the logic circuit addition section is displayed on the display section 2, the designer can observe the display data on the display section 2 to grasp a design condition.

The designer observing the display data on the display section 2 can input various instructions from the inputting section 3.

When a request for variation of grouping is inputted, the grouping variation acceptance section accepts the request for variation and requests the grouping section for the variation so that the last stage temporary positions are varied.

When a request for variation of the last stage temporary positions is inputted, the signal distribution circuit last stage arrangement variation acceptance section accepts the request for variation so that the last stage temporary positions are varied.

When a request for variation of an arrangement position of a logical component is inputted, the logical component arrangement variation acceptance section accepts the request for variation and requests the layout designing means 5 for variation of the arrangement position so that the arrangement position of the logical component is varied.

When a request for variation of the signal distribution circuit is inputted, the additional circuit variation acceptance section accepts the request for variation and requests the logic circuit addition section for variation of the signal distribution circuit so that the signal distribution circuit is varied.

Meanwhile, if a plurality of logical components to be diagnosed are arranged for mounting by the layout designing means 5, then the construction information decision section decides construction information of a diagnosis facilitation circuit (a connection order of the logical components where the diagnosis facilitation circuit is of the scan chain type, but addresses for scanning the logical components where the diagnosis facilitation circuit is of the address scan type) based on a result of arrangement of the plurality of logical components. Then, the layout designing means 5 performs arrangement and wiring of the diagnosis facilitation circuit based on the construction information. Since the logical designing means 4 (construction information decision section) and the layout designing means 5 cooperate with each other in this manner, a mounting arrangement of a diagnosis facilitation circuit can be decided in a short time.

In this instance, where the construction information of the diagnosis facilitation circuit is displayed on the display section 2, the designer can observe the display data on the display section 2 to grasp a design condition.

Further, when the designer observing the display data on the display section 2 inputs a request for variation of the construction information from the inputting section 3, the construction information variation acceptance section accepts the request for variation and requests the construction information decision section for variation of the construction information so that the construction information is varied.

By the way, after a mounting arrangement of the logical components is decided by the layout designing means 5, the temporary wiring line production section imaginatively wires the logical components, and the confusion degree calculation section calculates a confusion degree of wiring lines on the design object circuit based on a result of the imaginative wiring by the temporary wiring line production section. Then, the confusion degree thus calculated is displayed on the display section 2. Consequently, observing the confusion degree on the display section 2, the designer can determine whether or not the mounting arrangement by the layout designing means 5 is ideal or can estimate the success rate of wiring to be performed later.

In this instance, the confusion degree can be calculated, for each wiring layer of the design object circuit, as a ratio of the number of estimated used channels to the number of usable channels in each of a plurality of gratings on the design object circuit or as the number of free channels.

Then, if the designer observing the confusion degree on the display section 2 inputs a request for variation of the mounting arrangement of a logical component from the inputting section 3, then the logical component arrangement variation acceptance section accepts the request for variation and requests the layout designing means 5 for variation of the mounting arrangement so that the arrangement of the logical component is varied in accordance with the confusion degree.

Then, after mounting wiring of the logical components is decided by the layout designing means 5, the confusion degree calculated based on a result of the mounting wiring by the confusion degree calculation section is displayed on the display section 2. Consequently, the designer can observe the confusion degree on the display section 2 and determine whether or not the mounting wiring by the layout designing means 5 is ideal.

When a mounting arrangement of the logical components is decided by the layout designing means 5, an arrangement map of the design object circuit on which the logical components are arranged and a logical component list of the logical components to be arranged on the arrangement map are displayed in response to an instruction from the inputting section 3 on the display section 2. Consequently, the designer can perform arrangement of logical components on the arrangement map while confirming and grasping a logical component of an object of arrangement in the logical component list.

In this instance, by inputting an instruction from the inputting section 3, a logical component selected on the logical component list can be arranged on the arrangement map by the logical component arrangement section; by inputting an instruction from the inputting section 3, a logical component selected on the logical component list or the arrangement map can be deleted from the arrangement map by the logical component deletion section; and by inputting an instruction from the inputting section 3, a logical component selected on the logical component list or the arrangement map can be moved to another position on the arrangement map by the logical component movement section. Accordingly, by observing the arrangement map and the logical component list on the display section 2 and operating the inputting section 3, the designer can perform not only mounting arrangement of logical components but also deletion or movement of a logical component arranged once on the arrangement map of the display section 2.

Further, the information retrieval section searches individual information or connection information of a logical component selected on the logical component list or the arrangement map in response to an instruction from the inputting section 3, and the individual information or connection information thus searched out is displayed on the display section 2. Consequently, the designer can confirm information of a selected logical component on the display section 2.

In this instance, a connection information list between the selected logical component and all logical components connected to the selected logical component can be displayed as the connection information of the logical components, and logical lengths between the selected logical component and all logical components connected to the selected logical component are included in the connection information list.

Consequently, while observing and confirming the connection information list of the selected logical component and the logical lengths in the list on the display section 2, the designer can perform mounting arrangement of the logical components on the arrangement map of the display section 2.

Then, the displaying condition of that portion of the connection information including a logical length which violates a predetermined rule is changed over into a visually identifiable condition on the connection information list. Consequently, the designer can immediately conform that portion of the connection information on the display section 2.

Further, the catalogue arrangement section repetitively arranges a basic arrangement pattern on the arrangement map in response to an instruction from the inputting section 3. Consequently, when it is necessary to arrange a plurality of logical components in a same arrangement at a plurality of locations, the designer can input an instruction to arrange a plurality of logical components as a single basic arrangement pattern without arranging the logical components one by one.

In this instance, when a plurality of logical components are arranged on the arrangement map by the logical component arrangement section, the logical components can be simultaneously stored as the basic arrangement pattern, or a plurality of logical components arranged already and selected on the arrangement map can be stored as the basic arrangement pattern arbitrarily in response to an instruction from the inputting section 3.

It is to be noted that, during execution of mounting arrangement by the layout designing means 5, the external file writing section can write data of the arrangement in a text form into an external file. Consequently, the arrangement data can be stored or saved into the external file.

Further, immediately after mounting arrangement processing of the logical components by the layout designing means 5, a speed analysis by the speed analysis means 6 is performed based on a temporary wiring line length between the logical components according to the mounting arrangement, and the mounting arrangement of the logical components can be varied in response to a result of the speed analysis by the layout designing means 5.

Similarly, immediately after wiring processing of the logical components by the layout designing means 5, a speed analysis by the speed analysis means 6 is performed based on an actual wiring line length by the wiring, and the wiring of the logical components can be varied in response to a result of the speed analysis by the layout designing means 5.

Since the layout designing means 5 and the speed analysis means 6 cooperate with each other in this manner, after mounting arrangement or wiring is performed, evaluation of the mounting arrangement or the wiring can be performed immediately by a speed analysis.

Further, upon execution of a speed analysis by the speed analysis means 6, the path tracing section traces a wiring line path connected to a pin of a logical component designated by an instruction from the inputting section 3 from the pin, and the path delay display control section controls the display section 2 to display thereon a result of a delay calculation of the wiring line path traced by the path tracing section as a path delay list. Consequently, only by operating the inputting section 3 to designate a pin of a logical component, the designer can observe and confirm a result of a delay calculation of a wiring line path of the designated pin on the display section 2.

In this instance, by operating the inputting section 3 to designate a wiring line path on the path delay list, the designer can cause a route map of the wiring line path to be displayed on the display section 2 under the control of the route map display control section. Consequently, the designer can observe the route map and confirm the route of the wiring line path as well as delays and waveforms at individual pins on the wiring line path.

Further, by operating the inputting section 3 to designate a gate or a network on the route map, the designer can cause a mounting arrangement condition or a wiring condition of the gate or the network to be emphatically displayed on the display section 2 under the control of the mounting data display control section. Consequently, the designer can grasp the mounting data of the designated gate or network.

Further, the wiring line parasitic capacitance coding section codes, at successive points of time during wiring processing by the layout designing means 5, wiring line parasitic capacitances on the design object circuit, and the wiring line parasitic capacitance code display control section controls the display section 2 to display thereon code information obtained by such coding in a superimposed relationship on the arrangement map of the design object circuit on the display section 2. Consequently, the designer can observe, upon wiring processing, the code information of the wiring line parasitic capacitances displayed in a superimposed relationship on the arrangement map and perform wiring processing by the layout designing means 5 while taking the wiring line parasitic capacitances into consideration.

With the interactive circuit designing apparatus described in detail above, since the logical designing means 4, the layout designing means 5 and the speed analysis means 6 cooperate with each other to perform a circuit design in a single system, there is an advantage in that the turn-around time can be reduced to increase the speed of a circuit design such as an LSI or a printed circuit board remarkably.

Further, since the logical designing means (logic circuit addition section) 4 and the layout designing means 5 cooperate with each other, a logical design of a signal distribution circuit and a layout design of logical components to which the signal distribution circuit is to be added can be performed parallelly to each other. Consequently, a mounting arrangement of the signal distribution circuit can be decided in a short time, which contributes to an increase in speed of a circuit design.

In this instance, where various information in the circuit design such as last stage temporary positions of the signal distribution circuit, a plurality of logical component groups obtained by grouping the logical components, estimated wiring lengths from the last stage temporary positions to the individual logical components and the signal distribution circuit added by the logic circuit addition circuit is displayed, the designer can observe the display data and grasp the design condition. Further, by inputting an instruction in response to the display data, the grouping, the last stage temporary positions, the arrangement positions of the logical components and the signal distribution circuit can be varied, and consequently, any determination based on the display data can be reflected immediately on the circuit design.

Meanwhile, where the logical designing means (construction information decision section) 4 and the layout designing means 5 cooperate with each other, a logical design of a diagnosis facilitation circuit and a layout design of logical components to which the diagnosis facilitation circuit is to be added can be performed parallelly to each other. Consequently, a mounting arrangement of the diagnosis facilitation circuit can be decided in a short time, which contributes to an increase in speed of the circuit design.

In this instance, where construction information of the diagnosis facilitation circuit is displayed, the designer can observe the display data and grasp the design condition. Further, by inputting a request for variation of the construction information in response to the display data, the designer can vary the construction information, and consequently, any determination based on the display data can be reflected immediately on the circuit design.

By the way, upon decision of a mounting arrangement or a wiring scheme, where the confusion degrees of wiring lines between the individual logical components are calculated and displayed, the designer can observe the confusion degrees and analyze a determination of the arrangement condition or an estimation of a wiring success rate in detail. Consequently, the circuit design can be performed efficiently. Further, by observing the confusion degrees and inputting a request for variation of the arrangement of a logical component, the designer can vary the arrangement of the logical component in response to the confusion degree of it, and consequently, any determination based on the confusion degrees can be reflected immediately on the circuit design.

Further, upon mounting arrangement processing, where an arrangement map and a logic component list of the design object circuit are displayed, the designer can confirm and grasp logical components of the design object in the logical component list and perform mounting arrangement of a logical component on the arrangement map or deletion or movement of a logical component arranged once on the arrangement map. Accordingly, the designer can visually trace a connection condition between logical components on the arrangement map and perform various processing observing the logical component list. Consequently, an interactive circuit design can be performed effectively.

Further, where individual information or connection information of a selected logical component is displayed on the arrangement map, the designer can observe and confirm information regarding the selected logical component and perform mounting arrangement of the logical component on the display map of the display section 2. Consequently, an interactive circuit design can be performed effectively. In this instance, since the displaying condition of that portion of the connection information including a logical length which violates a rule is changed over to a visually identifiable condition. Consequently, the designer can immediately confirm that portion of the connection information, and accordingly, such a countermeasure as variation of the arrangement can be performed rapidly.

Further, by designating arrangement of a plurality of logical components as a single basic arrangement pattern, the designer can arrange the plurality of logical components in a same arrangement at a plurality of locations, which contributes very much to an increase in speed of the circuit design.

It is to be noted that, since, during execution of mounting arrangement, the arrangement data can be written in a text form into an external file and thus stored or saved in the external file, it is also advantageous in that the arrangement data can be restored upon emergency such as upon occurrence of a trouble with a program.

Further, where the layout designing means 5 and the speed analysis means 6 cooperate with each other, when mounting arrangement or wiring is performed, an evaluation of such mounting arrangement or wiring can be performed immediately by a speed analysis. Consequently, the turn-around time is reduced, which contributes to an increase in speed of a circuit design such as an LSI or a printed circuit board.

Further, where, upon execution of a speed analysis by the speed analysis means 6, a path delay list, a route map and mounting data of a pin of a designated logical component are displayed, the designer can visually specify a critical path (path which exhibits the slowest signal propagation) or the like readily. Consequently, the designer can immediately determine which portion on the design object circuit should be improved and besides can immediately recognize, by way of the emphasis display, at which position on the arrangement map the mounting data of a noticed path are present.

Further, since wiring line parasitic capacitances on the design object circuit can be displayed, at any point of time during wiring processing by the layout designing means 5, as code information in a superimposed relationship on the arrangement map of the design object circuit, the designer can immediately recognize, upon wiring processing, the wiring line parasitic capacitance at any position on the arrangement map based on the code information. Consequently, it is advantageous in that high speed wiring processing for a wiring line having a low signal propagation speed can be performed efficiently.

b. Construction of the Apparatus of the Embodiment

Figure 2:
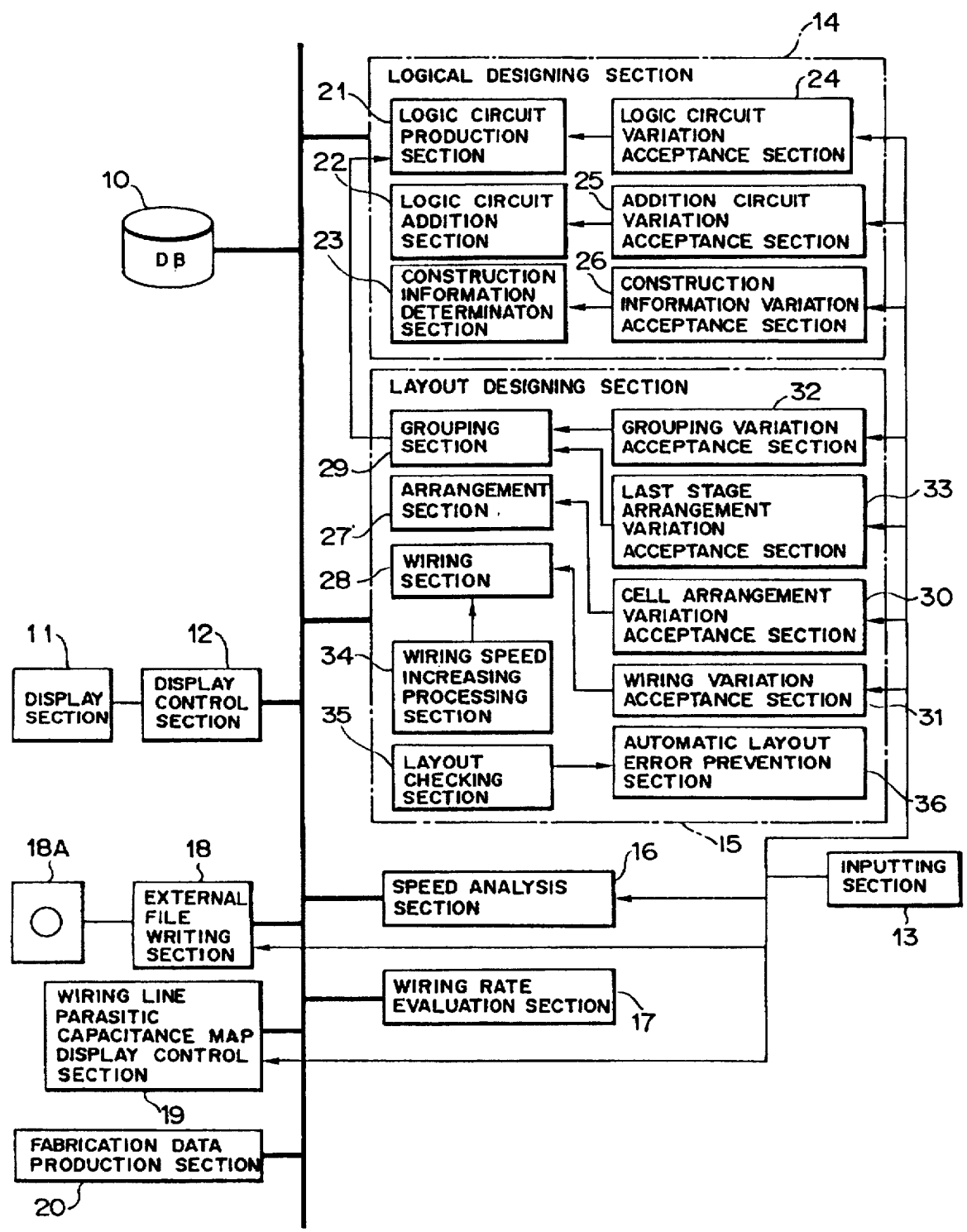
FIG. 2 is a block diagram of an interactive circuit designing apparatus showing a preferred embodiment of the present invention.

Referring now to FIG. 2, there is shown in block diagram an interactive circuit designing apparatus according to a preferred embodiment of the present invention. The interactive circuit designing apparatus includes a data base (DB) 10 for storing all necessary information including logic circuit information and layout information, a display section 11 for displaying a procedure of a design of a circuit which will be hereinafter described, a display control section 12 for controlling the displaying condition of the display section 11, and an inputting section 13 such as a keyboard or a mouse for inputting response information to display data by the designer when the display data are displayed on the display section 11 and observed by the designer.

The interactive circuit designing apparatus further includes a logical designing section 14 for performing a logical design of a design object circuit, and a layout designing section 15 for performing mounting arrangement of logical components (in the present embodiment, cells such as flip-flops), which form such design object circuit, based on a result of a logical design by the logical designing section 14 and then wiring the cells.

The interactive circuit designing apparatus further includes a speed analysis section 16 constructed in such a manner as hereinafter described with reference to FIG. 4 for performing a speed analysis by delay calculation for each of paths on a design object circuit in accordance with a result of a design by the layout designing section 15.

In the present embodiment, the logical designing section 14, the layout designing section 15 and the speed analysis section 16 are provided in a same system (apparatus) and connected to each other so as to communicate with each other at any time.

The interactive circuit designing apparatus further includes a wiring rate evaluation section 17 constructed in such a manner as hereinafter described with reference to FIG. 5 for evaluating, after arrangement processing or wiring processing by the layout designing section 15, a result of the arrangement of cells or a result of actual wiring and displaying a result of the evaluation on the display section 11.

The interactive circuit designing apparatus further includes an external file writing section 18 for writing, during execution of mounting arrangement of cells by the layout designing section 15, arrangement data of cells, which have been arranged before then, in the form of a text into another external file 18A different from the data base 10 at any time in response to an instruction from the inputting section 13.

The interactive circuit designing apparatus further includes a wiring line parasitic capacitance map display control section 19 constructed in such a manner as hereinafter described with reference to FIG. 6 for coding a wiring line parasitic capacitance, which arises from a power source wiring line and makes a significant factor which causes a delay of a signal, upon wiring designing of a signal line for which high speed signal transmission is required and controlling the display section 11 to display the thus coded wiring line parasitic capacitance in an overlaid condition as a character or characters or a design pattern on an interactive screen for wiring designing (arrangement map of the display section 11) as hereinafter described with reference to FIG. 29.

The interactive circuit designing apparatus further includes a fabrication data production section 20 for producing fabrication data for actually fabricating a circuit of an LSI, a printed circuit board or the like based on final design data obtained by a design through interactive communications with a designer using the display section 11, inputting section 13, logical designing section 14, layout designing section 15, speed analysis section 16 and so forth described above.

The logical designing section 14 includes a logic circuit production section 21, a logic circuit addition section 22, a construction information determination section 23, a logic circuit variation acceptance section 24, an additional circuit variation acceptance section 25 and a construction information variation acceptance section 26.

The logic circuit production section 21 automatically produces logic circuits of a design object circuit except those logic circuits which are added after a layout design such as a clock distribution circuit, a reset distribution circuit and a diagnosis facilitation circuit (testing circuit or scan checking circuit).

The logic circuit addition section 22 automatically produces and adds as logic circuits a clock distribution circuit and a reset distribution circuit from signal sources (drivers) for a clock signal, a reset signal and so forth to individual cells (flip-flops and so forth) based on a result of grouping by a grouping section 29 which will be hereinafter described.

The construction information determination section 23 automatically determines, at a stage wherein cells such as flip-flops to be diagnosed are arranged for mounting by the layout designing section 15, construction information of a diagnosis facilitation circuit for diagnosing the individual cells (such as a connection order of flip-flops in the scan chain type or scanning addresses of individual cells in the address scanning type) partially or entirely based on a result of the arrangement.

Logic circuits produced and added by the logic circuit production section 21 and the logic circuit addition section 22 described above, respectively, are displayed on the display section 11 under the control of the display control section 12, and also construction information determined by the construction information determination section 23 is displayed on the display section 11 under the control of the display control section 12. A designer will thus observe the display data and instruct to vary a result of an automatic design or the like by way of the inputting section 13.

The logic circuit variation acceptance section 24 accepts a request for variation of a logic circuit (logic circuit produced by the logic circuit production section 21) inputted from the inputting section 13 in response to a display of the display section 11 and requests the logic circuit production section 21 for variation of the logic circuit. Similarly, the additional circuit variation acceptance section 25 accepts a request for variation of an additional circuit (signal distribution circuit such as a clock distribution circuit or a reset distribution circuit) inputted from the inputting section 13 in response to a display of the display section 11 and requests the logic circuit addition section 22 for variation of the additional circuit, and the construction information variation acceptance section 26 accepts a request for variation of construction information inputted from the inputting section 13 in response to a display of the display section 11 and requests the construction information determination section 23 for variation of the construction information.

The layout designing section 15 includes an arrangement section 27, a wiring section 28, a grouping section 29, a cell arrangement variation acceptance section 30, a wiring variation acceptance section 31, a grouping variation acceptance section 32, a last stage arrangement variation acceptance section 33, a wiring speed increasing processing section 34, a layout checking section 35 and an automatic layout error prevention section 36.

Figure 3:
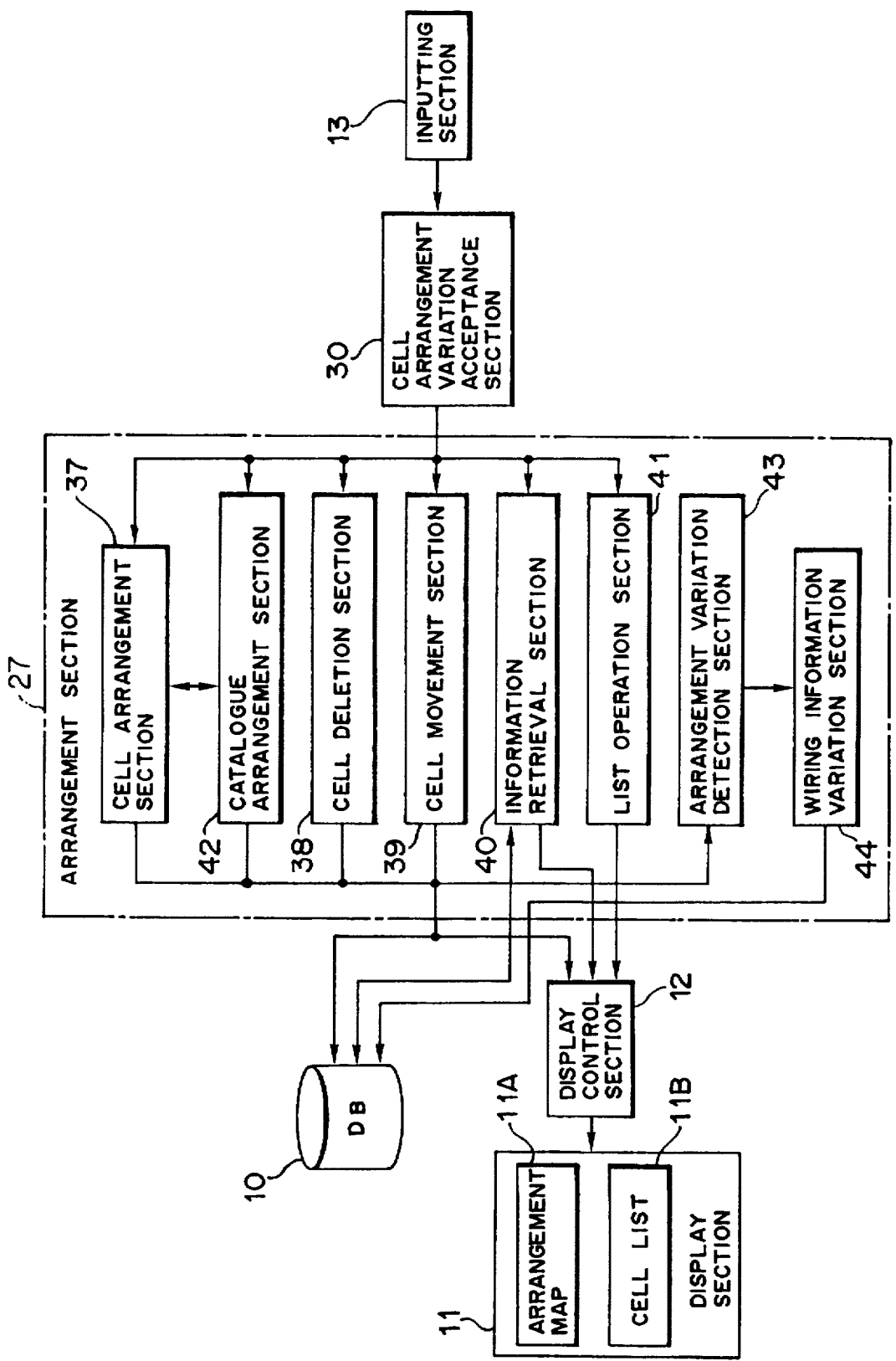
FIG. 3 is a block diagram showing a detailed construction of an arrangement section of the interactive circuit designing apparatus of FIG. 2.

The arrangement section 27 is constructed in such a manner as hereinafter described with reference to FIG. 3 and arranges parts (cells) such as flip-flops for mounting on a design object circuit based on a logic circuit produced by the logic circuit production section 21, an additional circuit added by the logic circuit addition section 22 and construction information determined by the construction information determination section 23. The arrangement section 27 is changed over between an automatic arrangement mode and a manual arrangement mode, in which it operates in response to manual operation of the inputting section 13, in response to an instruction from the inputting section 13.

The wiring section 28 automatically wires cells after all cells are arranged for mounting on a design object circuit by the arrangement section 27. Also the wiring section 28 is changed over between an automatic arrangement mode and a manual arrangement mode, in which it operates in response to manual operation of the inputting section 13, in response to an instruction from the inputting section 13.

The grouping section 29 automatically groups, at a stage wherein cells such as flip-flops to which a signal such as a clock signal and a reset signal is to be distributed are arranged for mounting by the arrangement section 27, the cells such as flip-flops for temporary positions at the last stage (buffers; refer to FIG. 9) of a clock distribution circuit, a reset distribution circuit and so forth. The grouping section 29 is changed over, in response to an instruction from the inputting section 13, between a mode in which all of cells arranged for mounting are grouped and another mode in which such cells are grouped partially.

A result of arrangement by the arrangement section 27, a result of wiring by the wiring section 28 and a result of grouping (such temporary positions at the last stage as described above and cell groups) by the grouping section 29 described above are displayed on the display section 11 under the control of the display control section 12. The designer will thus observe the display data and input an instruction to vary the results of processing by way of the inputting section 13. It is to be noted that, when a result of grouping by the grouping section 29 is displayed, estimated wiring line lengths from such temporary positions at the last stage to individual cells are displayed simultaneously.

The cell arrangement variation acceptance section 30 accepts a request for variation of a cell arrangement position inputted from the inputting section 13 in response to a display of the display section 11 and requests the arrangement section 27 for variation of the cell arrangement position. The wiring variation acceptance section 31 accepts a request for variation of a wiring line inputted from the inputting section 13 in response to a display of the display section 11 and requests the wiring section 28 for variation of the wiring line.

Similarly, the grouping variation acceptance section 32 accepts a request for variation of grouping inputted from the inputting section 13 in response to a display of the display section 11 and request the grouping section 29 for variation of the grouping. The last stage arrangement variation acceptance section 33 accepts a request for variation of a last stage temporary position inputted from the inputting section 13 in response to a display of the display section 11 and requests the grouping section 29 for variation of the last stage temporary position.

The wiring speed increasing processing section 34 automatically moves a wiring line of a network designated from the inputting section 13 in response to a display on the interactive screen (display section 11) and another wiring line in the proximity of the wiring line of the designated network to reduce the influence of a wiring line parasitic capacitance to assure a high speed of signal transmission. It is to be noted that, by displaying a wiring line parasitic capacitance map on the display section 11 under the control of the wiring line parasitic capacitance map display control section 19, the designer can accurately instruct the wiring speed increasing processing section 34 to perform its processing.

The layout checking section 35 checks a result of arrangement by the arrangement section 27 and a result of wiring by the wiring section 28 and has a function of checking a non-wired interval, the width of a wiring line, the length of a wiring line, the length of a parallel wiring line, a wiring line parasitic capacitance, a mask design rule and so forth as well as another function of causing a result of the check to be displayed on the display section 11 and a further function of causing a non-wired interval to be displayed on the display section 11.

The automatic layout error prevention section 36 automatically prevents, when it is instructed from the inputting section 13 to automatically prevent a layout error, a layout error such as a violation of a line length limitation or a violation of a spacing.

As seen in FIG. 2, the interactive circuit designing apparatus of the present embodiment is constructed centering around the single data base 10 and is adapted to perform a circuit design interactively such that multiple windows are displayed on the display section 11 under the control of the display control section 12 and the designer will observe the window displays and input various instructions by way of the inputting section 13. Then, in order to determine an arrangement of a cell such a as flip-flop for mounting by the layout designing section 15, an arrangement map 11A (refer to FIG. 17(b)) of a design object circuit on which the cells are to be mounted in accordance with an instruction from the inputting section 13 and a cell list 11B (refer to FIG. 17(a)) on which cells to be arranged on the arrangement map are displayed on the display section 11 under the control of the display control section 12.

The arrangement section 27 of the layout designing section 15 automatically performs arrangement of cells when the designer inputs an instruction to arrange cells by way of the inputting section 13 while observing such a display as described above. Referring now to FIG. 3, the arrangement section 27 includes a cell arrangement section 37, a cell deletion section 38, a cell movement section 39, an information retrieval section 40, a list operation section 41, a catalogue arrangement section 42, an arrangement variation detection section 43 and a wiring information variation section 44.

The cell arrangement section 37 arranges a cell selected from the cell list 11B on the arrangement map 11A in response to an instruction from the inputting section 13. The cell deletion section 38 deletes a cell selected from the cell list 11B or the arrangement map 11A from the arrangement map 11A in response to an instruction from the inputting section 13. The cell movement section 39 moves a cell selected from the cell list 11B or the arrangement map 11A to another position designated on the arrangement map 11A in response to an instruction from the inputting section 13. By making use of the functions of the cell arrangement section 37, the cell deletion section 38 and the cell movement section 39, cells on the arrangement map 11A can be moved, deleted or exchanged in the midst of arrangement of cells.

The information retrieval section 40 retrieves the data base 10 for various information such as individual cell information or connection information of a cell selected on the cell list 11B or the arrangement map 11A in response to an instruction from the inputting section 13 and causes the information obtained by such retrieval to be displayed on the display section 11.

In this instance, as such connection information, a connection information list between a selected cell (noticed cell) and all cells to be connected to the selected cell is displayed. The connection information list includes a logical length of a connection network of the noticed cell, and also the logical length is displayed on the display section 11.

The information retrieval section 40 changes, when such logical length as just described violates a predetermined rule, the displaying condition of a portion of the connection information including the logical length which violates the rule to a visually identifiable condition on the connection information list. Further, when the noticed cell is moved by the cell movement section 39, the information retrieval section 40 automatically updates the connection information list among cells.

The list operation section 41 operates and controls the displaying condition of any of various lists including the cell list 11B displayed on the display section 11 and has a function of automatically changing over, for example, when a cell is arranged on the cell list 11B in response to an instruction as described above, the displaying condition of the cell list 11B to another condition which allows selection of a next cell.

The catalogue arrangement section 42 stores a basic arrangement pattern for arranging a plurality of cells in a same arrangement as a catalogue and repetitively arranges the basic arrangement pattern on the arrangement map 11A in response to an instruction from the inputting section 13 as hereinafter described in detail with reference to FIGS. 22 to 25. In this instance, the basic arrangement pattern may be stored in such a fashion that a plurality of cells are stored as a basic arrangement pattern simultaneously when the cells are arranged on the arrangement map 11A by the cell arrangement section 37 or a plurality of cells selected on the arrangement map 11A and arranged already in response to an instruction from the inputting section 13 are stored as a basic arrangement pattern.

The arrangement variation detection section 43 automatically detects and recognizes, after completion of arrangement processing, a location at which the arrangement has been varied. The wiring information variation section 44 automatically produces, based on bulk information and cell information, wiring information required in wiring processing by the wiring section 28 for a variation location detected by the arrangement variation detection section 43.

Figure 4:
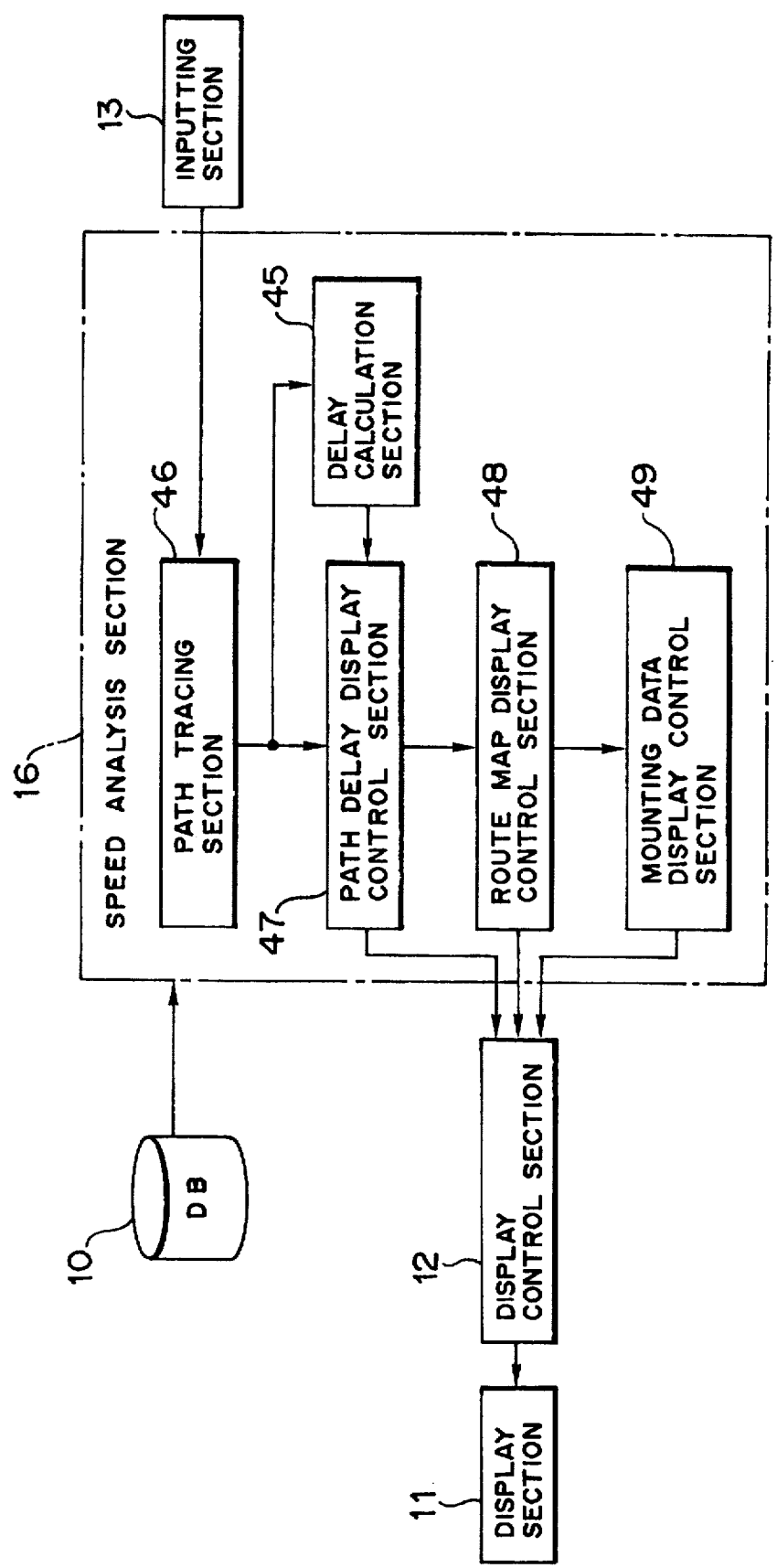
FIG. 4 is a block diagram showing a detailed construction of a speed analysis section of the interactive circuit designing apparatus of FIG. 2.

Referring now to FIG. 4, the speed analysis section 16 includes a delay calculation section 45, a path tracing section 46, a path delay display control section 47, a route map display control section 48 and a mounting data display control section 49.

The delay calculation section 45 performs a delay calculation for each wiring path on a design object circuit in accordance with a result of a design by the layout designing section 15.

The path tracing section 46 traces a wiring path connected to a pin of a cell designated by an instruction from the inputting section 13 upon execution of a speed analysis from the designated pin to a target pin in a forward direction (direction from the input toward the output) or a backward direction (direction from the output toward the input).

Figure 27:
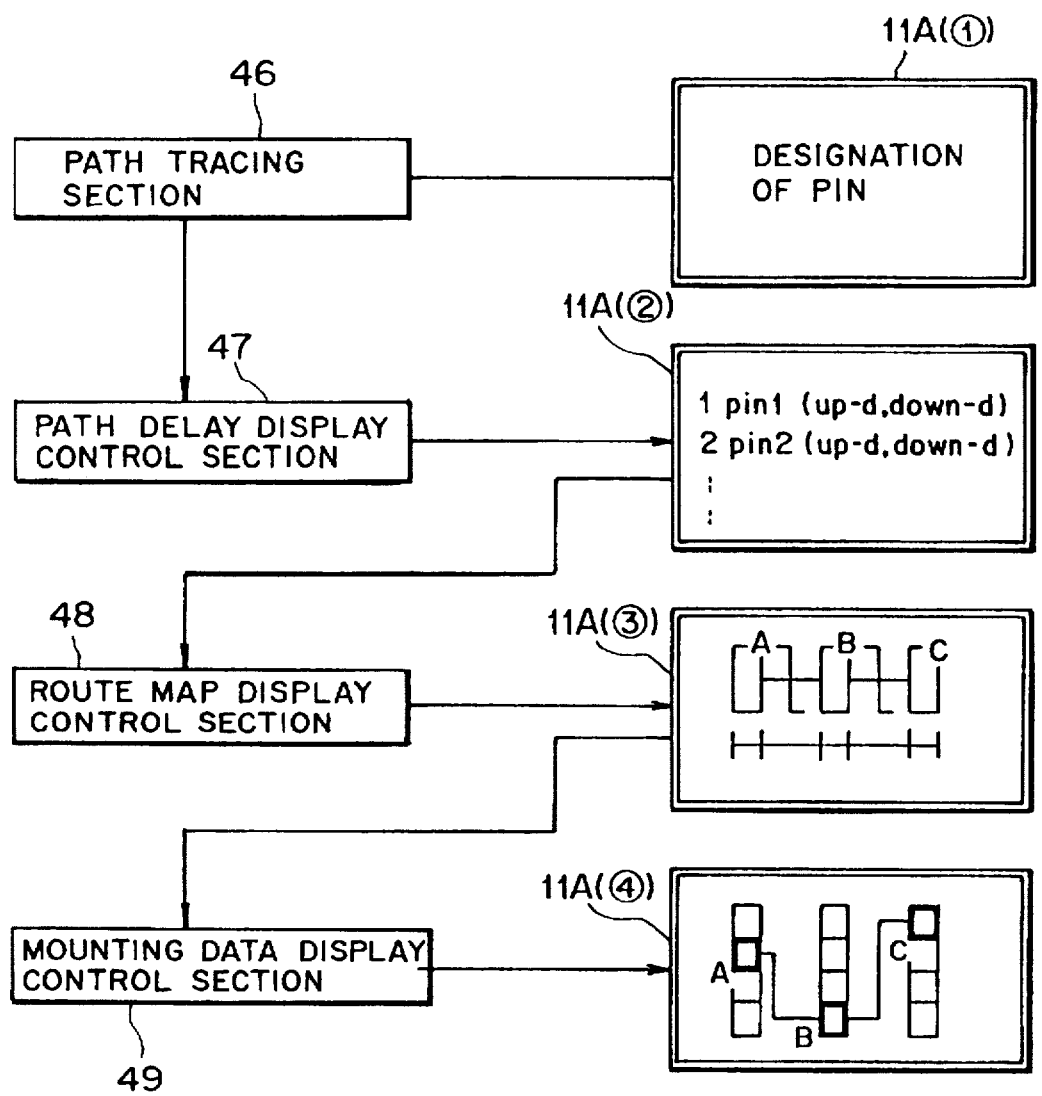
FIG. 27 is a flow diagram illustrating a displaying operation upon speed analysis.

The path delay display control section 47 controls the display section 11 so as to display a delay calculation result calculated by the delay calculation section 45 for a wiring path traced by the path tracing section 46 as a path delay list (refer to FIG. 27).

The route map display control section 48 controls the display section 11 so as to display, for a wiring path designated on a path delay list in response to an instruction from the inputting section 13, various information (which will be hereinafter described with reference to FIG. 28) such as a route of the wiring path, a delay and a waveform at each pin of the wiring path and so forth as a route map.

The mounting data display control section 49 controls the display section 11 (arrangement map 11A) so as to display a mounting arrangement condition and a wiring condition of a gate or a network designated by a route map displayed on a window in response to an instruction from the inputting section 13 in a high brightness or in a different color.

Figure 5:
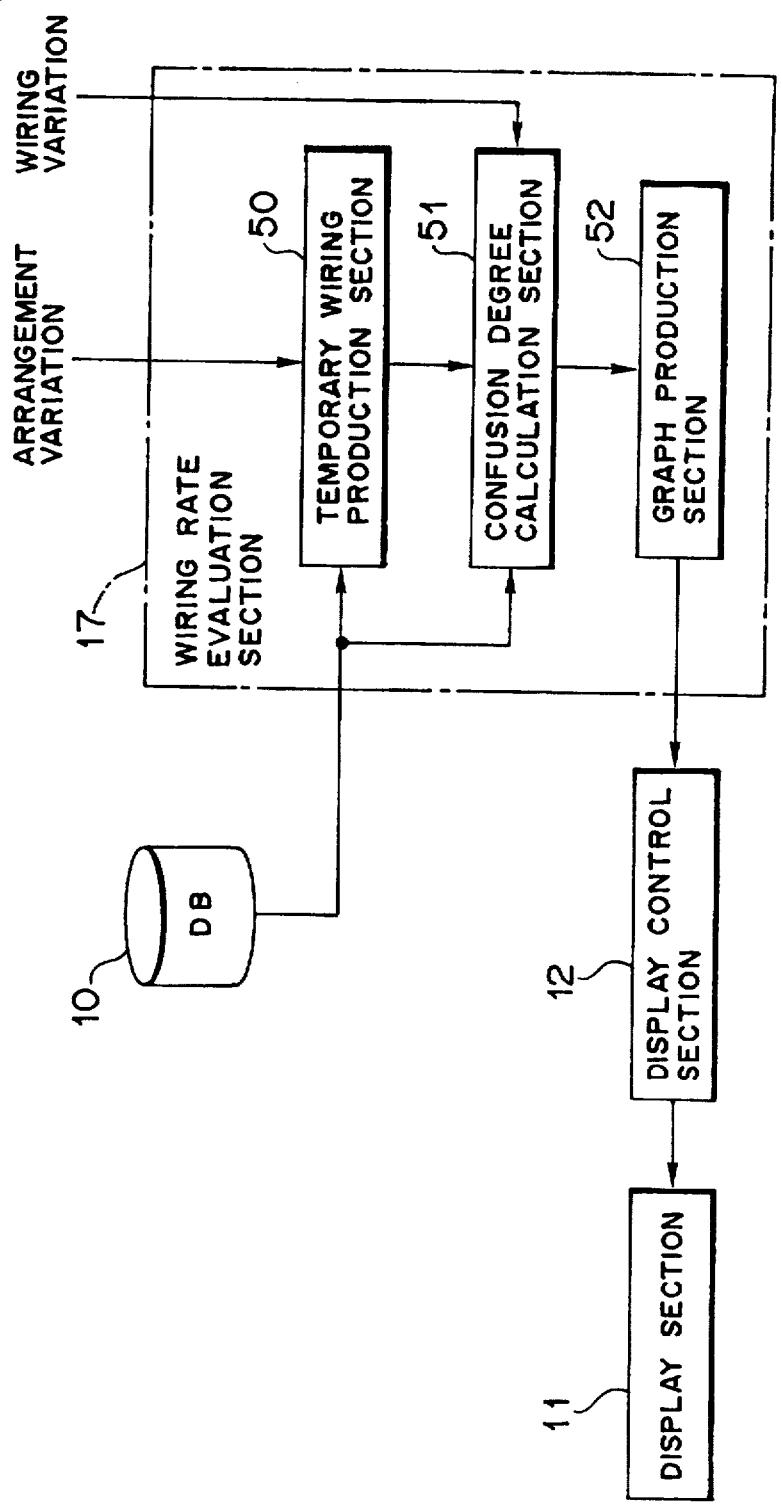
FIG. 5 is a block diagram showing a detailed construction of a wiring rate evaluation section of the interactive circuit designing apparatus of FIG. 2.

Referring now to FIG. 5, the wiring rate evaluation section 17 includes a temporary wiring production section 50, a confusion degree calculation section 51 and a graph production section 52.

The temporary wiring production section 50 performs, at a stage wherein an arrangement of cells for mounting is determined by the layout designing section 15, temporary wiring between cells (networks) in a tree representation such as a Steiner's tree or schematic wiring.

The confusion degree calculation section 51 calculates a confusion degree of wiring lines (channels) on a design object circuit based on a result of temporary wiring by the temporary wiring production section 50 in accordance with such a procedure as will be hereinafter described with reference to FIGS. 14 to 16. The graph production section 52 converts a result of calculation by the confusion degree calculation section 51 into a graph to be displayed on the display section 11, and a result of such graphing (confusion degree) is displayed on the display section 11 under the control of the display control section 12.

It is to be noted that a confusion degree may be calculated and graphed by the confusion degree calculation section 51 and the graph production section 52, respectively, otherwise at a stage wherein a mounting wiring scheme between cells is determined by the layout designing section 15. In this instance, the designer can grasp an actual condition of use of channels.

Figure 6:
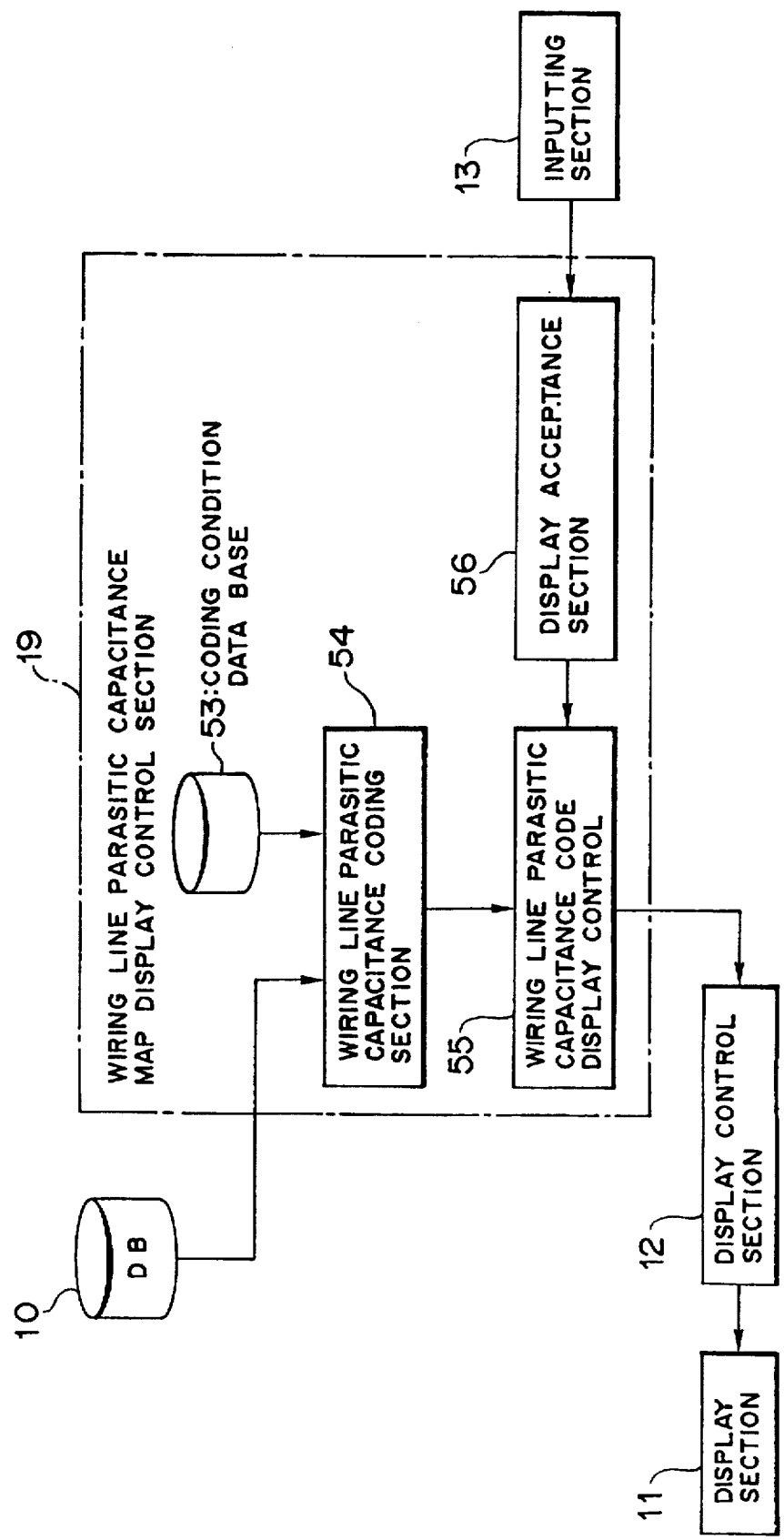
FIG. 6 is a block diagram showing a detailed construction of a wiring line parasitic capacitance map display control section of the interactive circuit designing apparatus of FIG. 2.

Referring now to FIG. 6, the wiring line parasitic capacitance map display control section 19 includes a coding condition data base 53, a wiring line parasitic capacitance coding section 54, a wiring line parasitic capacitance code display control 55 and a display acceptance section 56.

The coding condition data base 53 stores in advance codes (characters, graphic patterns or the like) in accordance with which wiring line parasitic capacitances corresponding to various arrangements and wiring line conditions (coding conditions) on a design object circuit can be displayed as hereinafter described with reference to FIG. 29.

The wiring line parasitic capacitance coding section 54 reads out a result of arrangement and a result of wiring by the layout designing section 15 from the data base 10 and encodes a wiring line parasitic capacitance on a design object circuit with reference to a coding condition of the coding condition data base 53.

The wiring line parasitic capacitance code display control 55 controls the display section 11 so as to display code information coded by the wiring line parasitic capacitance coding section 54 in a superimposed relationship with the arrangement map 11A at each position of a design object circuit on the display section 11 thereby to display a wiring line parasitic capacitance map. It is to be noted that code information may alternatively be stored once from the wiring line parasitic capacitance coding section 54 into the data base 10.

The display acceptance section 56 accepts a request for displaying of a wiring line parasitic capacitance map inputted from the inputting section 13 and sends a request for displaying of the wiring line parasitic capacitance map to the wiring line parasitic capacitance code display control 55.

c. General Flow of Operations of the Apparatus of the Embodiment

Subsequently, a general flow of operations of the interactive circuit designing apparatus of the present embodiment having the construction described above will be described with reference to the flow charts (steps S1 to S23) shown in FIGS. 7 and 8.

Figure 7:
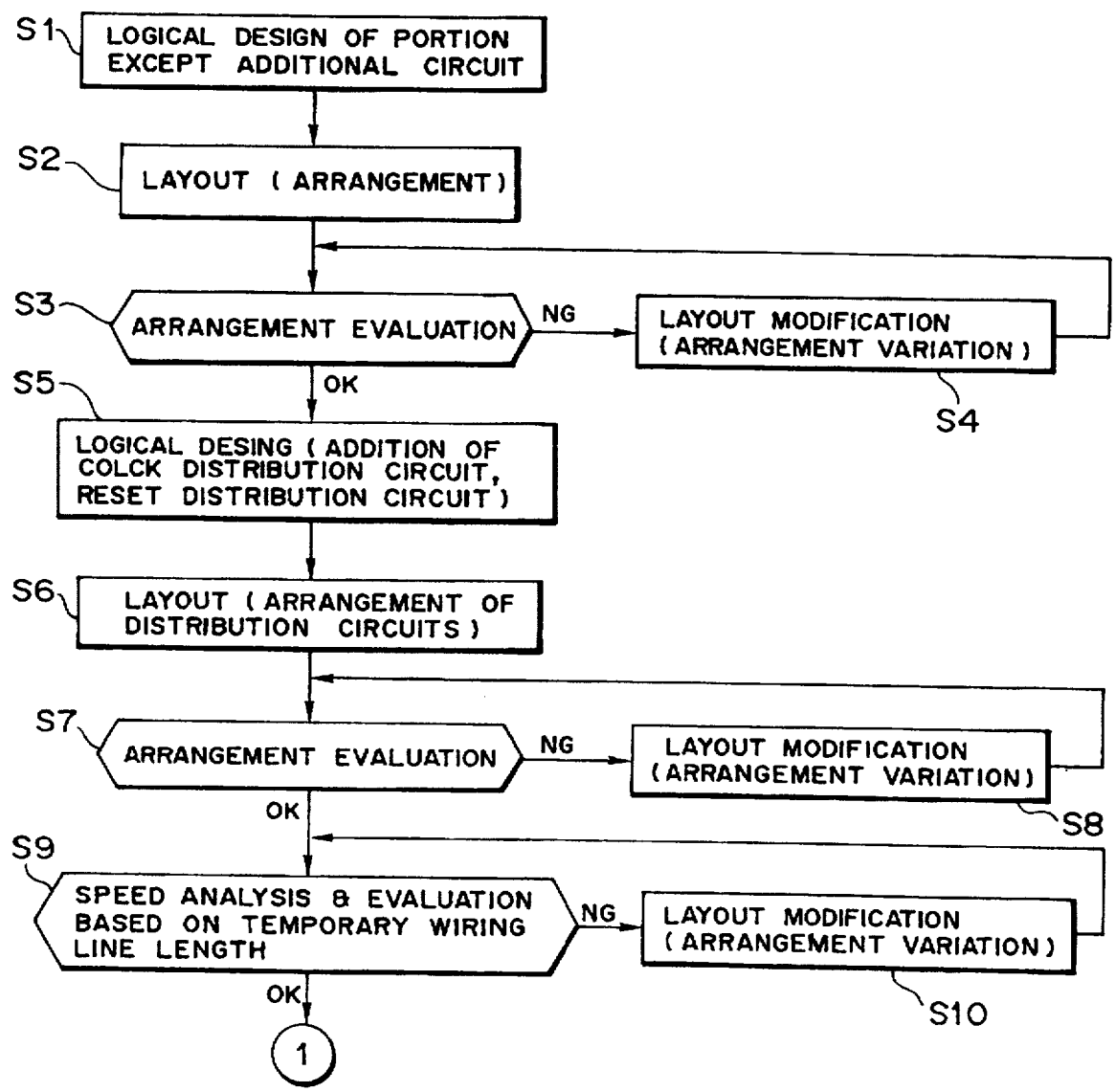
FIGS. 7 and 8 are flow charts illustrating a general flow of operations of the interactive circuit designing apparatus of FIG. 2.

Referring first to FIG. 7, the logic circuit production section 21 of the logical designing section 14 first produces logic circuits of a portion of a design object circuit except logic circuits which are added after a layout design such as a clock distribution circuit, a reset distribution circuit, a diagnosis facilitation circuit and so forth (step S1). The design of the logic circuits is performed automatically in the automatic mode. However, in the manual mode, the designer will observe the displaying condition of the display section 11 and request for variation of any of the produced logic circuits by way of the inputting section 13 to perform a design of logic circuits interactively.

Based on a result of the logical design at step S1, the arrangement section 27 of the layout designing section 15 performs mounting arrangement processing of cells (step S2). Such arrangement of cells is performed automatically in the automatic mode. However, in the manual mode, the designer will observe the displaying condition of the display section 11, which will be hereinafter described with reference to FIGS. 17 to 26, and operate the inputting section 13 to perform the arrangement of cells interactively.

After completion of the layout (arrangement) at step S2, a result of evaluation (confusion degree) by the wiring rate evaluation section 17 is displayed on the display section 11. Consequently, the designer will observe the confusion degree displayed on the display section 11 and determine whether or not the mounting arrangement by the arrangement section 27 is ideal or estimate the rate of success of wiring which will be performed later to evaluate the result of the arrangement by the arrangement section 27 (step S3).

If the evaluation of the arrangement reveals some problem, then a request for variation will be inputted to the layout designing section 15 by way of the inputting section 13 to perform amendment to the layout such as variation of the arrangement of cells interactively (step S4), whereafter arrangement evaluation is performed at step S3 again. It is to be noted that detailed operation of the wiring rate evaluation section 17 and the displaying condition of a result of evaluation will be hereinafter described with reference to FIGS. 14 to 16.

If it is determined at step S3 that the result of the arrangement is good, then the logic circuit addition section 22 of the logical designing section 14 adds logic circuits as a signal distribution circuit (additional circuits; a clock distribution circuit and a reset distribution circuit in the present embodiment) for distributing signals such as a clock signal, a reset signal and so forth to cells (step S5). Details of the addition processing of such signal distribution circuits will be hereinafter described with reference to FIGS. 9 and 10. Also the addition processing is performed automatically in the automatic mode. However, in the manual mode, the designer will observe the displaying condition of the display section 11 and operate the inputting section 13 to perform the addition processing interactively with the interactive circuit designing apparatus.

Then, based on the result of the logical design at step S5, the arrangement section 27 of the layout designing section 15 performs mounting arrangement processing of cells constituting a clock distribution circuit or a reset distribution circuit in a substantially similar manner as at step S2 described above.

After completion of the layout (arrangement) at step S6, a result of evaluation by the wiring rate evaluation section 17 is displayed on the display section 11. Consequently, similarly as at step S3, the designer will observe the confusion degree displayed on the display section 11 and evaluate the result of the arrangement by the arrangement section 27 (step S7). Then, if some problem is found out in the arrangement result, then the designer will input a request for variation to the layout designing section 15 by way of the inputting section 13 to perform amendment to the layout such as variation of the arrangement of cells (step S8). Thereafter, evaluation of the arrangement is performed at step S7 again.

If it is determined at step S7 that the result of the arrangement is good, the delay calculation section 45 of the speed analysis section 16 calculates delays (signal propagation times) of individual paths based on temporary wiring line lengths between the arranged cells and evaluate a result of the speed analysis (step S9).

At the stage of step S9, since no wiring processing has been performed, the wiring line lengths between the cells are calculated temporarily based on the tree representation such as a Steiner tree or schematic wiring and a speed analysis is performed using the temporary wiring line lengths. It is to be noted that, upon evaluation of the result of the speed analysis, the display section 11 provides such a display as hereinafter described with reference to FIGS. 27 and 28, and the designer will observe the display and evaluate the result of the speed analysis.

If the evaluation of the speed analysis reveals some problem, the designer will input a request for variation to the layout designing section 15 by way of the inputting section 13 to perform amendment to the layout such as variation of the arrangement of cells interactively (step S10). Then, delays are calculated again at step S9, and the delays before and after the variation are displayed and fed back to the data base 10 to perform evaluation of the speed analysis.

Figure 8:
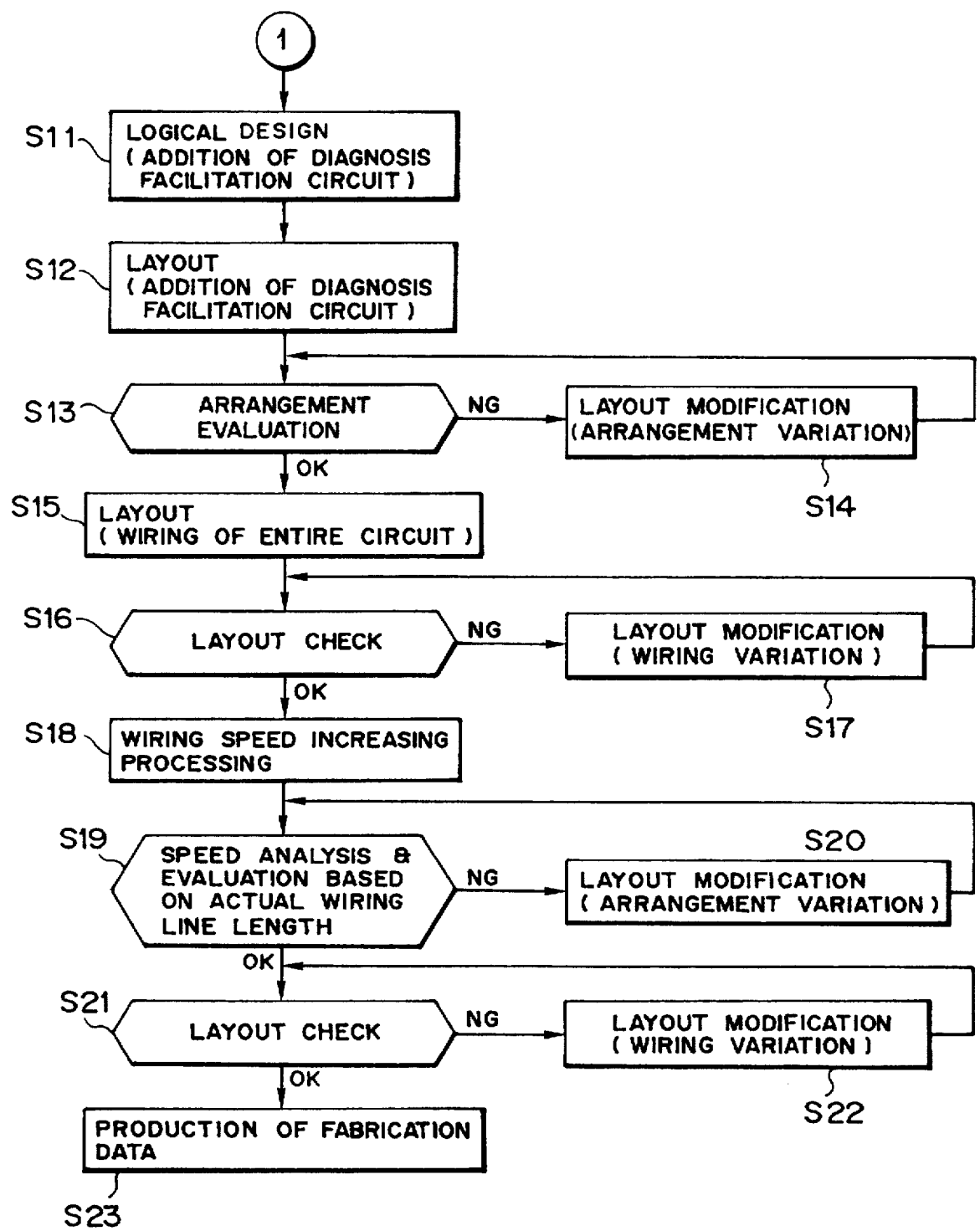

Referring now to FIG. 8, if it is determined at step S9 of FIG. 7 that the result of the speed analysis is good, in order to add a diagnosis facilitation circuit which is outside the object of the speed analysis, the construction information determination section 23 of the logical designing section 14 decides construction information of a diagnosis facilitation circuit (a cell connection order in the scan chain type, or a scan address of each cell in the address scanning type) based on a result of the arrangement of cells obtained by the processing up to step S10 (step S11). Details of the addition processing of a diagnosis facilitation circuit will be hereinafter described with reference to FIGS. 11 to 13. Also the addition processing is performed automatically in the automatic mode. However, in the manual mode, the designer will observe the displaying condition of the display section 11 and operate the inputting section 13 to perform the addition processing interactively with the interactive circuit designing apparatus.

Then, based on the construction information decided at step S11, the arrangement section 27 of the layout designing section 15 performs mounting arrangement processing of cells constituting a diagnosis facilitation circuit in a substantially similar manner as at steps S2 and S6 described above (step S12).

After completion of the layout (arrangement) at step S12, a result of evaluation by the wiring rate evaluation section 17 is displayed on the display section 11. Consequently, similarly as at steps S3 and S7, the designer will observe the confusion degree displayed on the display section 11 and evaluate the result of the arrangement by the arrangement section 27 (step S13). Then, when some problem is involved in the evaluation, the designer will input a request for variation to the layout designing section 15 by way of the inputting section 13 to perform amendment to the layout such as variation of the arrangement of cells (step S14). Thereafter, evaluation of the arrangement is performed again at step S13.

If it is determined at step S13 that the result of the arrangement is good, the wiring section 28 of the layout designing section 15 performs wiring processing between all of the cells arranged in the processing up to step S13 or S14 (step S15). Also the wiring processing is performed automatically in the automatic mode. However, in the manual mode, the designer will observe the displaying condition of the display section 11 and operate the inputting section 13 to perform the wiring processing interactively with the interactive circuit designing apparatus.

After completion of the layout (arrangement) at step S15, the layout checking section 35 of the layout designing section 15 checks the circuit arranged and wired by the processing up to step S15 (in regard to non-wired intervals, widths and lengths of wiring lines, lengths of parallel wiring lines, wiring line parasitic capacitances, mask design rules and so forth) and causes a result of the check and the non-wired intervals to be displayed in the form of a list on the display section 11. The designer will observe the result of the check and the non-wired intervals displayed on the display section 11 and determines whether or not the result of the check is acceptable (step S16).

When the result of the check is NG (no good, unacceptable), the designer will input a request for variation to the layout designing section 15 from the inputting section 13 to perform amendment to the layout such as variation of a wiring line (step S17), and then a check of the layout is performed at step S16 again.

If it is determined at step S16 that the result of the check is OK (acceptable), the wiring speed increasing processing section 34 of the layout designing section 15 automatically moves a wiring line of a network instructed by way of the inputting section 13 in response to the display on the display section 11 and another wiring line in the proximity of the wiring line of the network so as to reduce the influence of any wiring line parasitic capacitance to assure a high speed of signal propagation (step S18).

In this instance, when the notification of the network designated by way of the inputting section 13 is received, the wiring speed increasing processing section 34 extracts wiring information regarding the network from the data base 10. Then, the wiring speed increasing processing section 34 performs processing to move the wiring line of the network in a direction to reduce the influence of any adjacent wiring line (that is, processing to increase the distance between parallel wiring lines in a parallel wiring line interval or like processing) so that the wiring line may not be influenced at all or may be influenced but in the minimum while the connection relationship thereof is maintained. If an aimed speed (delay) cannot be achieved even after the wiring line of the designated network is moved, the wiring line of the designated network is further moved so as to further increase the distance between the wiring line of the designated network and the adjacent wiring line.

A result of the movement by the wiring speed increasing processing section 34 is displayed immediately by the display section 11, and re-calculation of a signal delaying time (delay) of the network for which the wiring condition has been varied is performed by the delay calculation section 45 of the speed analysis section 16. The designer can thus observe a result of the re-calculation for a delay to confirm the improved condition of the delay by the wiring line easily.

Figure 28:
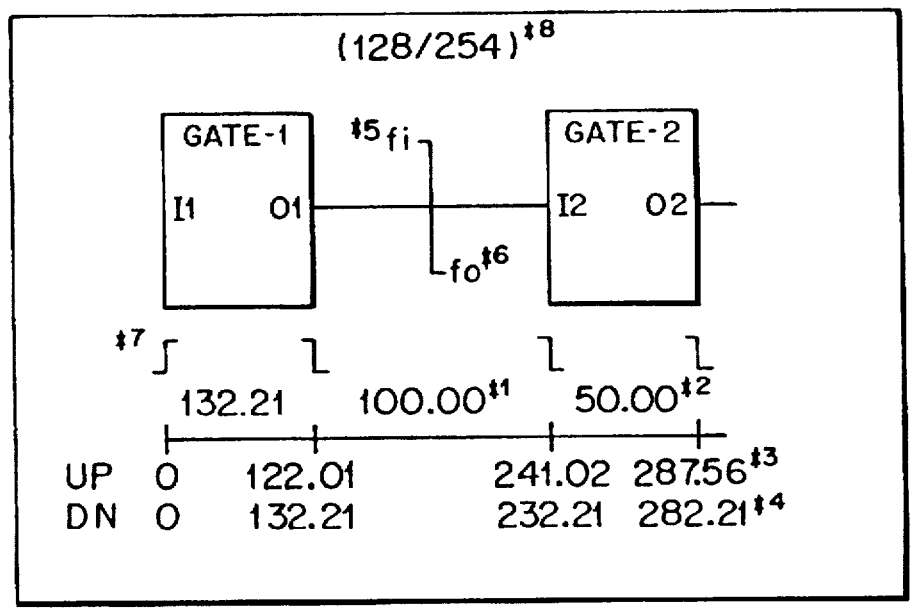
FIG. 28 is a diagrammatic view illustrating an example of a display on an arrangement map upon speed analysis.

After the wiring line speed increasing processing is performed at step S18, the delay calculation section 45 of the speed analysis section 16 calculates delays (signal propagation times) for the individual paths based on the lengths (wiring line lengths) of the actual wiring lines laid between the cells by the processing up to step S18 to perform a speed analysis and evaluates a result of the speed analysis (step S19). It is to be noted that, also in this instance, such displaying processing as will be hereinafter described with reference to FIGS. 27 and 28 is performed by the display section 11 similarly as at step S9, and the designer will thus observe the display and perform evaluation of the result of the speed analysis.

If a result of the evaluation of the speed analysis proves some problem, then the designer will input a request for variation to the layout designing section 15 from the inputting section 13 to perform amendment to the layout such as variation of a wiring line interactively (step S20). Then, re-calculation for a delay is performed at step S19 again, and displaying of the delays before and after the variation and feedback of them to the data base 10 are performed to perform evaluation of the speed analysis.

If it is determined at step S19 that the result of the speed analysis is good, then the layout checking section 35 of the layout designing section 15 checks the circuit arranged and wired by the processing at steps up to step S19 or S20 similarly as at step S16 and S17, and a result of the check and non-wired intervals in the form of a list are displayed on the display section 11. The designer will observe the result of the check and the non-wired intervals displayed on the display section 11 and determine whether or not the check is OK or not (step S21).

When the result of the check is NG, the designer will input a request for variation to the layout designing section 15 from the inputting section 13 to perform amendment to the layout such as variation of a wiring line (step S22). Then, a check of the layout is performed again at step S21.

On the contrary, if it is determined at step S21 that the result of the check is OK, then the fabrication data production section 20 produces fabrication data for actual fabrication of a circuit such as an LSI or a printed circuit board based on final design data produced by the processing at steps up to step S21 or S22.

d. Techniques of Adding a Signal Distribution Circuit and a Diagnosis Facilitation Circuit Here, the techniques of adding a clock distribution circuit and a reset distribution circuit described hereinabove in connection with steps S5 and S6 of FIG. 7 will be described with reference to FIGS. 9 and 10, respectively.

Figure 9:
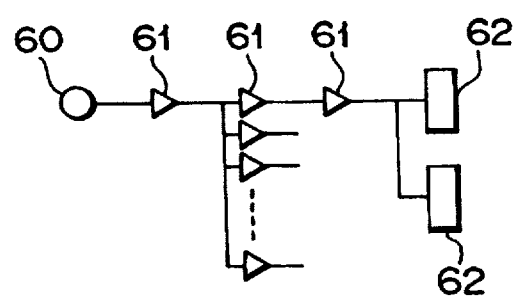
FIG. 9 is a diagrammatic view showing an example of an ordinary clock distribution circuit or reset distribution circuit.

FIG. 9 shows an ordinary circuit construction for distributing a clock signal or a reset signal to cells such as flip-flops. Referring to FIG. 9, the circuit shown includes a driver (signal source) 60 for generating a clock signal or a reset signal, a plurality of buffers 61 provided at a plurality of stages for amplifying and transmitting a signal from the driver 60, and a plurality of cells 62 such as flip-flops to which signals are directly distributed from those of the buffers 61 at the last stage.

A signal distribution circuit has such a basic construction as shown in FIG. 9, and the number of stages of buffers 61 and the maximum fan-out number depends upon the design object circuit. Further, an optimum signal distribution circuit is produced at a stage wherein the arrangement positions of the cells 62 such as flip-flops which receive a clock signal or a reset signal distributed thereto are decided. However, where a signal distribution circuit is required for simulation of a logic circuit, the arrangement positions of the cells of it need not be decided.

In the present embodiment, the grouping section 29 of the layout designing section 15 and the logic circuit addition section 22 of the logical designing section 14 generate and add logic circuits as signal distribution circuits while the mounting arrangement positions of the cells 62 such as flip-flops in a design object circuit such as an LSI or a printed circuit board are taken into consideration.

If it is presumed that a plurality of signal distribution systems are involved, the designer will instruct, at the stage of a logic design at step S1 of FIG. 7, each of the cells 62 such as flip-flops, which receive signals, from which one of the signal distribution systems it should receive a signal. Such instruction information will be hereinafter referred to as "clock system information" or "reset system information".

Figure 10:
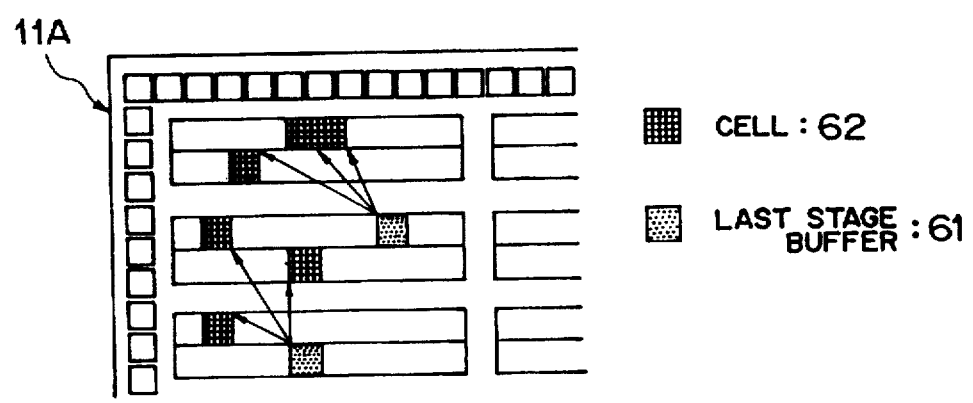
FIG. 10 is a diagrammatic view showing an example of a display of a result of grouping of cells.

At the stage wherein the arrangement of the cells 62 is completed by the arrangement section 27 of the layout designing section 15 (at the stage wherein the determination at step S3 in FIG. 7 is OK or YES), in the automatic generation system for a signal distribution circuit constituted from the grouping section 29 and the logic circuit addition section 22, the grouping section 29 first determines a group of cells to be driven by an output of one of the buffers 61 at the last stage of the signal distribution circuit. Then, for example, as shown in FIG. 10, the grouped condition of the cells 62 is displayed in the arrangement window (arrangement map 11A) of the display section 11. It is to be noted that two groups are shown in FIG. 10 each including one buffer 61 and three cells 62 interconnected by individual arrow marks.

While such cell groups are formed and displayed as seen in FIG. 10, an actual signal distribution circuit is not generated as yet. Only after the designer confirms such cell groups as shown in FIG. 10 on the display section 11 and varies the cell groups if necessary and then completes final grouping of the cells 62, a signal distribution circuit is generated as a logic circuit by the logic circuit addition section 22 (step S5 of FIG. 7).

It is to be noted that, upon grouping processing of cells by the grouping section 29, the arrangement positions of those of the buffers 61 at the last stage of the signal distribution circuit are set temporarily, and also the temporary arrangement positions of the buffers 61 at the last stage are displayed on the display section 11.

Then, the designer will observe the arrangement window displayed on the display section 11 and input a request for variation of the grouping from the inputting section 13 to vary the cell groups thus decided automatically. In this instance, in the present embodiment, estimated lengths of wiring lines from the buffers 61 at the last stage of the temporary signal distribution circuit are displayed on the display section 11 as a material for determination by the designer of whether or not the groups should be varied. Further, by observing such display and inputting a request for variation from the inputting section 13, the designer can vary the arrangement positions of the buffers 61 at the last stage of the signal distribution circuit or the arrangement positions of the cells 62 arranged for mounting by the arrangement section 27.

At the stage wherein such variation of the groups or the like by the grouping section 29 is completed, a signal distribution circuit from the driver 60 to the cells 62 is generated based on the temporary positions of the buffers 61 at the last stage and the cell groups and is added as a logic circuit by the logic circuit addition section 22 of the logical designing section 14.

Also the signal distribution circuit added by the logic circuit addition section 22 in this manner is displayed on the display section 11. Thus, the designer can observe the display and input a request for variation of the signal distribution circuit from the inputting section 13 to vary the signal distribution circuit.

Based on the logic circuit as a signal distribution circuit added in such a manner as described above, a mounting arrangement of the cells constituting the signal distribution circuit is determined by the arrangement section 27 of the layout designing section 15 (step S6 of FIG. 7).

Since the logical designing section 14 (logic circuit addition section 22) and the layout designing section 15 cooperate with each other in this manner, a logic design of a signal distribution circuit and a layout design of cells to which the signal distribution circuit is to be added can be proceeded in parallel to each other. Consequently, a mounting arrangement of a signal distribution circuit for distributing a clock signal or a reset signal can be decided in a short time, which contributes to high speed designing of a circuit.

Further, since the temporary positions of the buffers 61 at the last stage of a signal distribution circuit, cell groups obtained by grouping, estimated lengths of wiring lines from the temporary positions at the last stage to individual cells, various information regarding a circuit design of a signal distribution circuit or the like added by the logic circuit addition section 22 are displayed on the display section 11, the designer can observe the display data to grasp a design condition. Further, by inputting various requests in response to the display data, the designer can vary the groups obtained by grouping, the temporary positions at the last stage, the arrangement positions of the cells and/or the signal distribution circuit or circuits, and consequently, there is another advantage in that determination based on display data can be reflected immediately on a circuit design.

It is to be noted that, while the foregoing description is given of the case wherein a circuit for distributing a clock signal or a reset signal is added, the present invention is not limited to the specific configuration but can be applied similarly as described above also to another case wherein a circuit for distributing any other signal to different cells is added. Further, the temporary positions of the buffers 61 at the last stage set upon grouping are inherited as they are upon automatic arrangement by the arrangement section 27.

Subsequently, a technique of adding a diagnosis facilitation circuit described in connection with steps S11 and S12 of FIG. 8 will be described with reference to FIGS. 11 to 13.

First, examples of a construction of an ordinary diagnosis facilitation circuit will be described with reference to FIGS. 11 and 12.

Figure 11:
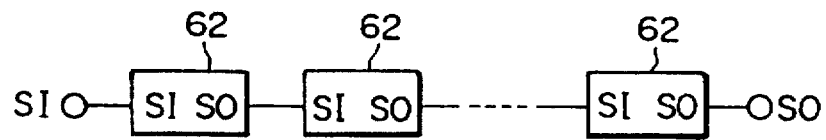
FIG. 11 is a block diagram showing a diagnosis facilitation circuit of an ordinary scan chain type.

FIG. 11 shows a diagnosis facilitation circuit of the scan chain type. Referring to FIG. 11, the diagnosis facilitation circuit of the scan chain type includes cells 62 such as flip-flops as an object of diagnosis whose scan-in terminals SI and scan-out terminals SO are connected to each other so that the cells 62 are connected in series (like a chain) forming a scan chain. A predetermined signal is inputted to a scan-in terminal SI of the diagnosis facilitation circuit which is connected to the outside while a signal is extracted from a scan-out terminal SO of the diagnosis facilitation circuit, and a diagnosis of the cells 62 constituting the scan chain is performed using the signal extracted from the scan-out terminal SO of the diagnosis facilitation circuit.

Figure 12:
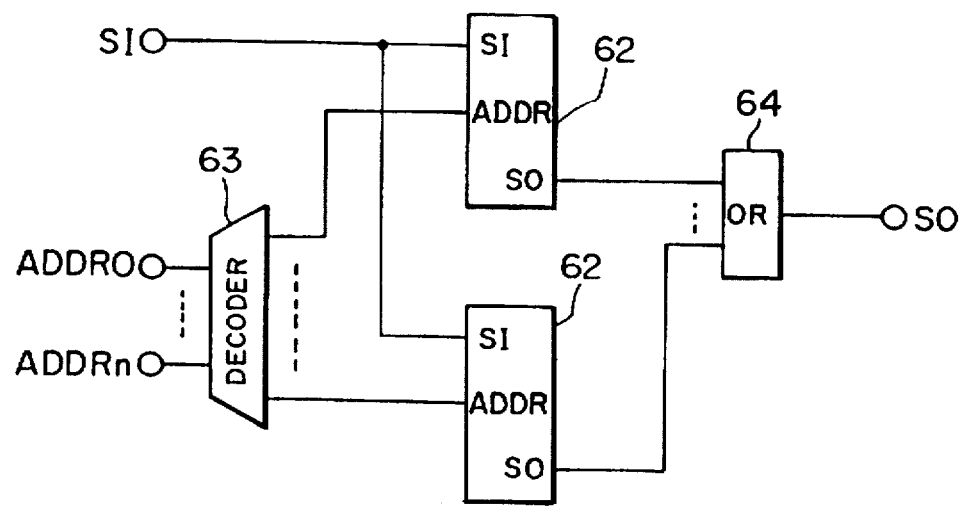
FIG. 12 is a block diagram showing a diagnosis facilitation circuit of an ordinary address scan type.

FIG. 12 shows a diagnosis facilitation circuit of the address scan type. Referring to FIG. 12, the diagnosis facilitation circuit includes a decoder 63 for selecting one of cells 62 as an object of diagnosis (scanning object). The decoder 63 decodes address signals ADDR0 to ADDRn supplied thereto from the outside to specify one of the cells 62 as an object of diagnosis and raises the level of a signal to an address terminal ADDR of the cell 62 to select the cell 62 as an object of diagnosis.

The diagnosis facilitation circuit of the address scan type further includes an OR gate 64 which logically ORs signals from scan-out terminals SO of the cells 62.

Thus, a predetermined signal is inputted to a scan-in terminal SI of one of the cells 62 selected by the decoder 63, and a diagnosis of the selected cell 62 is performed based on a signal extracted from the scanout terminal SO of the cell 62 by way of the OR gate 64.

Each of such diagnosis facilitation circuits of the scan chain type and the address scan type is fabricated in an optimum form at a stage wherein the arrangement positions of the scan points (cells 62) such as flip-flops are decided. However, where a diagnosis facilitation circuit is required for evaluation of a diagnosis ratio or for evaluation of a number of bates to be added, the arrangement positions of the scan points need not be decided.

In the present embodiment, while the scan points (mounting arrangement positions) of the cells 62 such as flip-flops of a design object circuit such as an LSI or a printed circuit board are taken into consideration, construction information which will be hereinafter described is decided by the construction information determination section 23 of the logical designing section 14, and a logic circuit as a diagnosis facilitation circuit of the scan chain type are generated and added.

Further, if it is presumed that a plurality of scan chain systems are involved, then the designer can input, at the stage of the logical design at step S1 of FIG. 7, cells 62, which are connected in series to construct a scan chain, by way of the inputting section 13 in accordance with the necessity. Further, if cells 62 which are to be included in different scan chains are present in the same design object circuit, then the designer can input an instruction of this from the inputting section 13.

If no such instruction as described above is inputted, then cell connection orders of the individual scan chains are automatically decided based on a result of mounting arrangement of the cells 62 and the thus instructed scan chain number by the construction information determination section 23 at step S11 of FIG. 8. Then, in the arrangement window (arrangement map 11A) of the display section 11, connection orders of the cells 62 are displayed, for example, as seen in FIG. 13. It is to be noted that two scan chains are shown in FIG. 13 each including cells 62 connected in series by a series of arrow marks from a terminal 65 connected to the outside.

Figure 13:
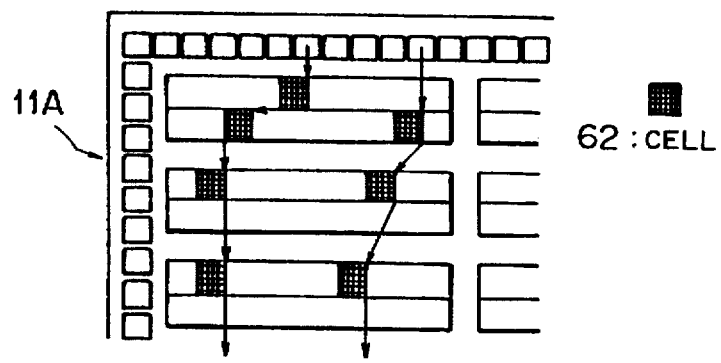
FIG. 13 is a diagrammatic view showing an example of a display of a cell connection order when the diagnosis facilitation circuit of the ordinary scan chain type of FIG. 11 is constructed.

Even if scan chains are formed and displayed in such a manner as seen in FIG. 13, an actual diagnosis facilitation circuit is not connected as yet. The designer will confirm the scan chains automatically decided as described above on the display section 11 as shown in FIG. 13 and vary the scan chains if necessary, and only after formation of final scan chains of the cells 62 is completed, connection of the diagnosis facilitation circuit of the scan chain type (scanning wiring between the cells 62) is not permitted.

It is to be noted that any cell connection order automatically decided by the construction information determination section 23 can be varied by the designer by inputting, observing the arrangement window displayed on the display section 11, a request for variation of the construction information from the inputting section 13. Further, the designer can vary the arrangement positions of the cells 62 arranged for mounting by the arrangement section 27 by inputting a request for variation of the arrangement positions of the cells 62 from the inputting section 13 at the stage of step S11 of FIG. 8.

Since mounting arrangement and wiring of a diagnosis facilitation circuit of the scan chain type are completed only by wiring the cells 62 as an object of diagnosis, after a cell connection order is decided as construction information at step 311 of FIG. 8, actual scanning wiring is performed at step S15 of FIG. 8, at which the cells 62 such as flip-flops are connected to construct a scan chain.

Since the logical designing section 14 (construction information determination section 23) and the layout designing section 15 cooperate with each other in this manner, a logic design of a diagnosis facilitation circuit and a layout design of cells 62 to be added to the diagnosis facilitation circuit can be proceeded in parallel with each other. Consequently, mounting arrangement and wiring of a diagnosis facilitation circuit for diagnosing the cells 62 can be determined in a short time, which contributes to an increase in speed of a circuit design.

In this instance, since the construction information of the diagnosis facilitation circuit is displayed on the display section 11, the designer can observe the display data to grasp a design condition. Further, by inputting a request for variation of the construction information in response to the display data, the designer can vary the construction information, and consequently, any determination based on the display data can be reflected immediately on the circuit design.

In contrast with the diagnosis facilitation circuit of the scan chain type described above, where the diagnosis facilitation circuit is of the address scan type, additional arrangement of such circuits such as the decoder 63, the OR gate 64 and so forth as shown in FIG. 12 is required after scan addresses of the cells 62 as an object of diagnosis are decided as construction information. Therefore, such circuits are generated and added as logic circuits by the logic circuit addition section 22 at step S11 of FIG. 8.

The diagnosis facilitation circuit added by the logic circuit addition section 22 in this manner is displayed on the display section 11. The designer can thus observe the display and input a request for variation of the diagnosis facilitation circuit from the inputting section 13 to vary the diagnosis facilitation circuit.

Then at step S12 of FIG. 8, the arrangement section 27 of the layout designing section 15 decides, based on the logic circuits thus added, mounting of the cells (decoder 63, OR gate 64 and so forth) constituting the diagnosis facilitation circuit.

e. Arrangement Evaluation Technique and Method of Displaying a Result of Evaluation Here, two examples of a technique of arrangement evaluation (operation of the wiring rate evaluation section 17) and a method of displaying a result of evaluation, which are performed at steps S3 and S7 of FIG. 7 and step S13 of FIG. 8, respectively, at a stage wherein a logical design and arrangement of a design object circuit will be described with reference to FIGS. 14 to 16.

In order to allow it to be determined at step S3, S7 or S13 whether or not a cell arrangement by the arrangement section 27 of the layout designing section 15 is ideal or to allow estimation of a success rate of wiring which is performed later, temporary wiring is performed between cells arranged at step S2, S6 or S12 by the temporary wiring production section 50 of the wiring rate evaluation section 17. The wiring estimation by the temporary wiring production section 50 is performed based on schematic wiring or on a tree representation such as a Steiner's tree as described hereinabove.

Then, based on a result of the temporary wiring, the confusion degree calculation section 51 of the wiring rate evaluation section 17 calculates a confusion degree of wiring lines on the design object circuit. The confusion degree thus calculated is graphed by the graph production section 52 and displayed on the arrangement map 11A of the display section 11, for example, as shown in FIG. 14 or 16. Consequently, the designer observes the confusion degree on the display section 11.

Figure 14:
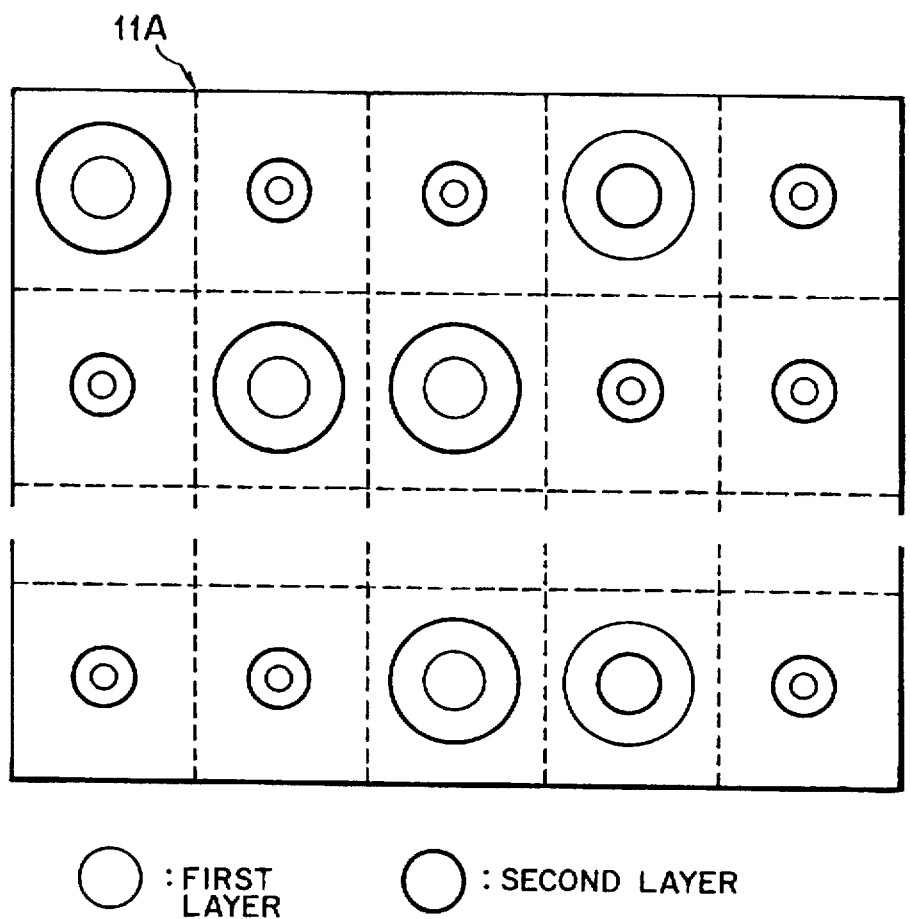
FIG. 14 is a diagrammatic view showing an example of a display of a result of wiring rate evaluation on an arrangement map.

Here, in the case of the example of display shown in FIG. 14, the confusion degree calculation section 51 divides the design object circuit (arrangement map 11A) into a large number of grating-like areas and calculates, for each of wiring layers of the design object circuit, the rate of the estimated used channel number (the number of temporary wiring lines produced by the temporary wiring production section 50) to the number of channels which can be used in each of the gratings (the number of wiring lines (signal lines) which cap pass through each grating), that is, an estimated channel utilization rate as a confusion rate.

The estimated channel utilization rates in the gratings in the individual layers calculated by the confusion degree calculation section 51 are converted into visual graphic patterns such as, for example, circles having the sizes which increase in proportion to the utilization rates, and are displayed in such graphic patterns on the display section 11 (arrangement map 11A).

In the example shown in FIG. 14, as the utilization rate increases, the diameter of the corresponding circle increases, and in each grating, the utilization rates of the first layer (wiring lines in a horizontal direction) and the second layer (wiring lines in a vertical direction) are displayed for identification from each other by way of a thick line and a thin line in each grating.

Further, if a grating area in which the estimated channel utilization rate exceeds a prescribed value is present, then the circle in the grating area is displayed in a color which calls an attention such as red. In this instance, the prescribed value can be set and varied by the designer.

Figure 16:
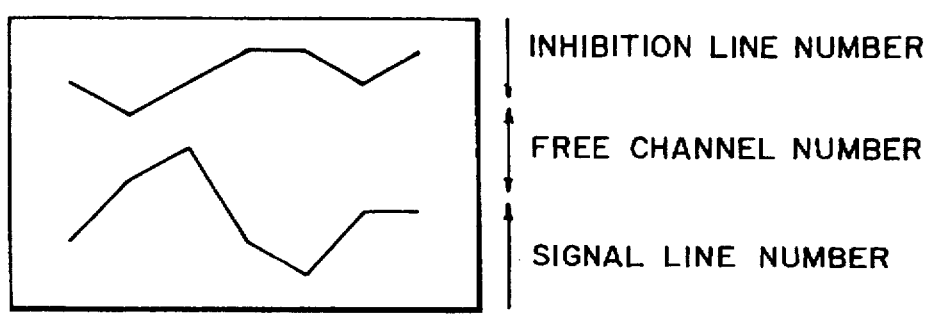
FIG. 16 is a diagrammatic view showing another example of a display of a result of wiring rate evaluation.

On the other hand, in the case of an example of a display shown in FIG. 16, the confusion degree calculation section 51 calculates, for each wiring line layer of the design object circuit, the number of channels (number of free channels) which can be thereafter used in regard to coordinates of the wiring line layer in the direction of a main wiring line as a confusion rate.

Then, the free channel numbers calculated by the confusion degree calculation section 51 are converted into a graph in the direction of a main wiring line for each wiring line layer by the graph production section 52 and displayed in the window on the display section 11.

Figure 15:
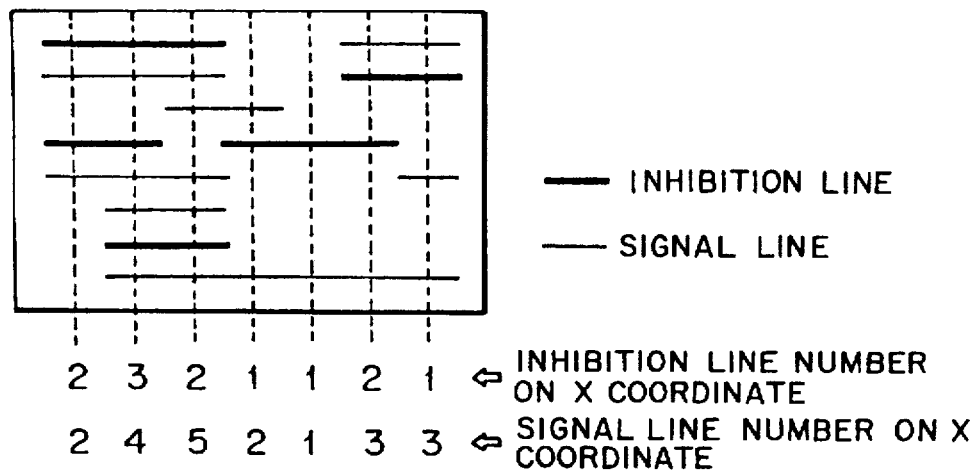
FIG. 15 is a diagrammatic view showing an example of wiring lines of inhibition lines and signal lines in a certain layer.

As a concrete example, a first layer wherein inhibition lines and signal lines are set as shown in FIG. 15 and the X direction is the direction of a main wiring line is considered. In this instance, the number of inhibition lines and the number of signal lines at each X coordinate are counted. Now, if it is assumed that, in the example shown in FIG. 15, a maximum of eight lines can be wired at each X coordinate, then such a graph as shown, for example, in FIG. 16 (a graph of free channel numbers, inhibition line numbers and signal line numbers with respect to the X coordinate axis) is produced based on the count values and displayed on the display section 11. If a plurality of wiring lines are involved, a graph similar to that of FIG. 16 is produced and displayed for each of the layers.

Where the confusion degrees of temporary wiring lines are displayed in the form of a graph on the display section 11 as shown in FIGS. 14 to 16, the designer can visually grasp an evaluation of a cell arrangement by the arrangement section 27 of the layout designing section 15 or an estimation of the success rate (estimation of the confusion degree) of wiring to be performed later. Consequently, the designer can perform amendment to the layout at step S4, S8 or S14 precisely based on the display.

Further, since the confusion degrees are displayed in such a manner as described above by the wiring rate evaluation section 17 after actual wiring at step S15 or S21 of FIG. 8 is completed, the designer can readily grasp an actual condition of use of channels only by observing the graph display on the display section 11.

Where confusion degrees of wiring lines between cells are calculated and displayed upon mounting arrangement or decision of wiring lines by the layout designing section 15 in this manner, the designer can observe the confusion degrees and analyze a determination of an arrangement condition or an estimation of a wiring line success rate in detail. Consequently, the designer can perform a circuit design efficiently. Further, by observing the confusion rates and inputting a request for variation of the arrangement of the cells, the designer can vary the arrangement of cells in accordance with the confusion rates and can reflect any determination based on the confusion rates immediately on the circuit design.

f. Cell Arrangement Technique and Displaying Condition upon Cell Arrangement

Here, a technique of arranging cells (operation of the arrangement section 27 of the layout designing section 15) which is performed at step S2 or S6 of FIG. 7 or at step S12 of FIG. 8 at a stage wherein a logical design of a design object circuit is completed and a displaying condition of the display section 11 upon such cell arrangement will be described with reference to FIGS. 17 to 26.

Figure 17A:
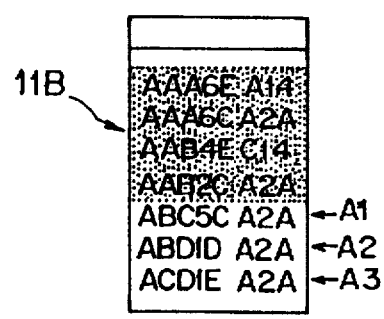
FIG. 17(a) is a diagrammatic view showing an example of a display of a cell list.
Figure 17B:
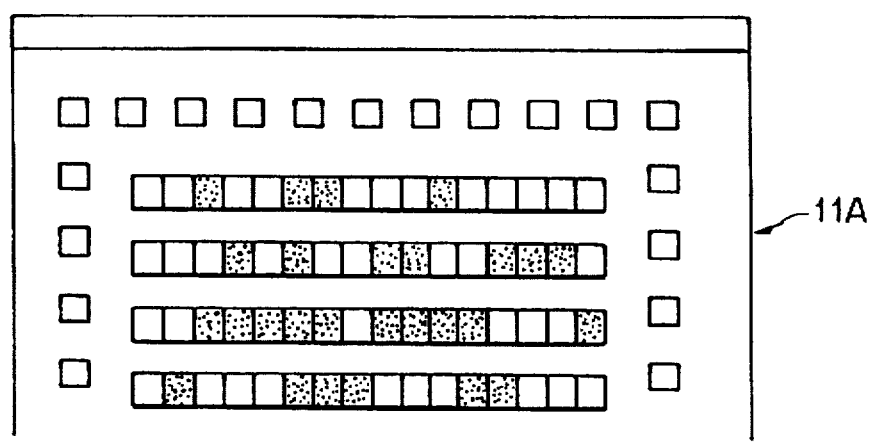
FIG. 17(b) is a diagrammatic view showing an example of a display on an arrangement map.

When arrangement of cells is performed at step S3, S7 or S13, that is, when a mounting arrangement of cells is determined by the arrangement section 27 of the layout designing section 15, such an arrangement map 11A as shown in FIG. 17(b) and such a cell list 11B as shown in FIG. 17(a) are displayed on the display section 11 under the control of the display control section 12.

Here, the arrangement map 11A shows a design object circuit on which a cell component is to be arranged in response to an instruction from the inputting section 13, and each location at which a cell has been disposed already is indicated in a special displaying condition such as screened or colored in a different color. Meanwhile, the cell list 11B indicates a list of cells to be arranged on the arrangement map 11A. It is to be noted that, in the cell list 11B, the displaying portion of information of each cell which has been selected and for which arrangement has been completed already is processed by such special displaying processing as screening or variation in color.

When it is tried to arrange non-arranged cells denoted by A1, A2 and A3 in the cell list 11B of FIG. 17(a) in order, an instruction will first be inputted from the inputting section 13 to select the item A1 of the cell list 11B. In this instance, in order to definitely indicate that the item A1 has been selected, the displaying portion of the item A1 is processed by such special displaying processing as screening or variation in color.

Thereafter, another instruction will be inputted from the inputting section 13 to designate cell arrangement positions in an area of the arrangement map 11A in which no cell has been arranged. Consequently, the designated cells are arranged at the designated positions on the arrangement map 11A by the function of the cell arrangement section 37, thereby completing the arrangement of the cells.

Upon completion of the arrangement of the cells, the selection item on the cell list 11B is automatically shifted to the item A2. Consequently, the designer need not particularly perform a selection operation on the cell list 11B and can thus be absorbed in the cell arranging operation on the arrangement map 11A. After completion of the arrangement of cells in the item A2, cells of the item 3 are automatically selected similarly. In this manner, the designer can perform arrangement of cells on the arrangement map 11A while confirming and grasping cells of an object of arrangement in the cell list 11B.

Meanwhile, when it is tried to delete a cell arranged once on the arrangement map 11A from the arrangement map 11A, a deletion mode will first be designated by way of the inputting section 13, and then a cell of an object of deletion will be selected directly on the arrangement map 11A or a cell of a corresponding item will be selected on the cell list 11B. In response to such selection, the cell is deleted automatically from the arrangement map 11A by the cell deletion section 38.

It is to be noted that, upon displaying of items on the cell list 11B, displaying locations of cells are processed by special processing so as to be displayed in different colors or the like so that it can be visually discriminated for each of the cells whether a cell has been arranged already or has not been arranged as yet or else is being arranged at present.

Subsequently, movement, deletion or exchange of cells on the arrangement map 11A within an arbitrary area will be described with reference to FIGS. 18 and 19.

Figure 18:
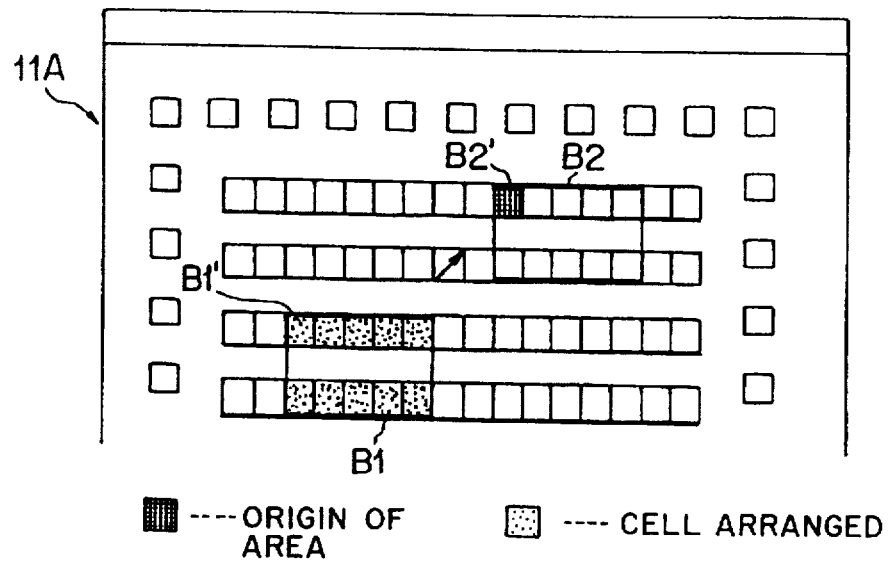
FIG. 18 is a diagrammatic view showing an example of a display of cells within a designated range on an arrangement map upon movement or deletion of cells.

When it is intended to move cells on the arrangement map 11A within an arbitrary area, a mode in which movement of cells within a designated area is performed will first be designated by way of the inputting section 13, and then an instruction will be inputted from the inputting section 13 to select cells to be moved, for example, as a rectangular area B1 as shown in FIG. 18. In this instance, it is defined that the origin of the area B1 be the left upper corner B1' of the selected rectangular area.

Then, the position to which the rectangular area is to be moved will be designated by an instruction from the inputting section 13. For example, when such a position as denoted by B in FIG. 18 is designated, the rectangular area B1 is displayed such that the origin B1' thereof is arranged at the position B2' (area B2 in FIG. 18).

At this stage, the two areas B1 and B2 remain displayed on the arrangement map 11A, and a menu for selection of whether or not actual movement should be performed is displayed. Here, if performance of movement is selected by way of the inputting section 13, then the cells in rectangular area B1 are actually moved into the rectangular area B2 by the cell movement section 39. It is to be noted that, if some other cell or cells have been arranged in the destination rectangular area B2, no overlapping cell is moved from within the rectangular area B1.

When it is intended to delete cells on the arrangement map 11A within an arbitrary area, a mode wherein deletion of cells within a designated area is performed will first be designated by way of the inputting section 13, and then an instruction will be inputted to select cells to be deleted as the rectangular area B1. Upon such selection, a menu for selection of whether or not actual deletion should be performed is displayed. Here, if performance of deletion is selected by way of the inputting section 13, then the cells in the rectangular area B1 are deleted actually from the arrangement map 11A by the cell deletion section 38.

Figure 19:
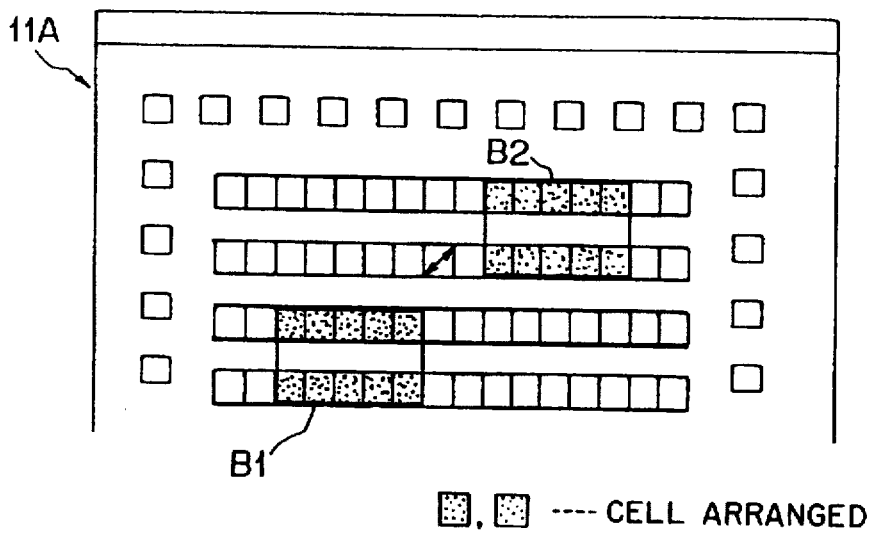
FIG. 19 is a similar view but showing an example of a display of cells within a designated range on an arrangement map upon exchanging of cells.

Also when it is intended to exchange cells on the arrangement map 11A within an arbitrary area, similarly as in the movement or deletion described above, a mode wherein exchange of cells within a designated area is performed will first be designated by way of the inputting section 13, and then an instruction will be inputted from the inputting section 13 to designate two areas B1 and B2 between which cells are to be exchanged as seen in FIG. 19. Upon such designation, a menu for selection of whether or not exchange should be performed actually is displayed. Here, if performance of exchange is selected, then cells in the rectangular areas B1 and B2 are exchanged for each other by the function of the cell movement section 39. In this instance, the origins of the rectangular areas B1 and B2 are disposed at the left upper corners of the respective rectangular areas.

As described above, by observing the arrangement map 11A and the cell list 11B on the display section 11 and operating the inputting section 13, the designer can perform not only mounting arrangement of cells but also deletion, movement or exchange of cells arranged once on the arrangement map 11A of the display section 11. Accordingly, by visually tracing a connection condition between cells on the arrangement map 11A and performing various processing observing the cell list 11B, the designer can perform an interactive circuit design effectively.

By the way, when it is intended to search connection information between cells disposed on the arrangement map 11A or information (individual is information) of such cells themselves, an information retrieval mode will first be designated by way of the inputting section 13, and then a cell on the arrangement map 11A or the cell list 11B will be selected by an instruction inputted from the inputting section 13.

After a cell of an object of information retrieval is selected, the data base 10 is retrieved for cells connected to the cell of the object of information retrieval, and connection conditions of the individual cells are displayed on the arrangement map 11A. Further, also the names of the cells, the positions of the cells on the arrangement map 11A, the sizes of the cells, the index names of the cells and so forth are displayed as display messages on the arrangement map 11A.

FIG. 20 shows an example of a display on the arrangement map upon arrangement information retrieval. In FIG. 20, an example of a display when a cell A arranged on the arrangement map 11A is selected as an object of arrangement information retrieval. In this instance, the displays of eight cells B to I connected to terminals a and b of the cell A are varied, and a network indicated by broken lines is displayed. The network can be represented in any of the Steiner's tree, the wire type or the star type representations, and the designation of the displaying form can be varied by the designer by operating the inputting section 13. It is to be noted that an example wherein the network is represented in the Steiner's tree representation is shown in FIG. 20.

The graphic form of a cell includes position information of terminals of the cell, and when the position selected on the arrangement map 11A by operation of the inputting section 13 is near to the position of a terminal of a cell, only a cell connected to the terminal is displayed on the arrangement map 11A, and as a message, it is displayed, in addition to the name of a network to be connected, whether or not the logical length of the network (calculated based on the Steiner's tree) satisfies a predetermined limit value.

Taking the example shown in FIG. 20 as an example, when the cell A is selected, if the selection point is near to the terminal a, then the displays of the four cells B to E connected to the terminal a are varied and a network between the terminals is displayed. In contrast, if the selection point is near to the terminal b, then the displays of the four cells F to I connected to the terminal b are varied and a network between the terminals is displayed.

It is to be noted that, when the cell A is moved from a position C1 to another position C2 while the network is displayed on the arrangement map 11A as shown in FIG. 21(a), the entire network relating to the thus moved cell A is re-drawn, and also the logical length of the network is calculated again and the network is displayed on the arrangement map 11A in such a manner as seen in FIG. 21(b).

In this manner, the designer can easily confirm, on the display section 11, connection information and so forth of a cell selected on the arrangement map 11A by way of the inputting section 13.

Accordingly, the designer can perform mounting arrangement of cells on the arrangement map 11A of the display section 11 while observing and confirming, on the display section 11, connection information of cells and/or logical lengths in the connection information list.

Further, in order to satisfy, when arrangement of cells is performed, a limited wiring length upon wiring, lengths of networks must be checked at the stage of logical lengths. Therefore, in the present embodiment, a connection information list of network lengths between cells connected to a certain cell is displayed on the display section 11 by the function of the information retrieval section 40. In particular, when an arbitrary cell on the arrangement map 11A is selected, all networks connected to the cell are searched, and the network length is calculated as a logical length based on a Steiner's tree and displayed on the list.

Once the connection information list is displayed, a mode wherein the connection information list is updated automatically when movement, retrieval or the like of a cell is performed can be set from the inputting section 13. Also it is possible to retrieve the connection information list for network information and display the thus found out network on the arrangement map 11A. Furthermore, by changing over the displaying condition of a portion of the connection information including the logical length which violates a predetermined rule to a condition wherein it can be visually identified on the connection information list, the designer can immediately confirm the portion of the connection information on the display section 11 and take such a countermeasure as variation of the arrangement rapidly.

Subsequently, a technique of arranging (catalogue arrangement) cells in a certain predetermined form (basic arrangement pattern) repetitively on the arrangement map 11A will be described with reference to FIGS. 22 to 25. In preparation for such catalogue arrangement, a basic arrangement pattern including a plurality of cells is stored in advance.

Such basic arrangement pattern may be stored using any of the following two techniques. According to a first one of the techniques, a basic arrangement pattern is stacked simultaneously while performing arrangement of cells by the cell arrangement section 37. According to the other second technique, a basic arrangement pattern is stacked making use of cells arranged already on the arrangement map 11A. Any of the techniques requires displays of the arrangement map 11A and the cell list 11B.

In the former storage technique wherein a basic arrangement pattern is stacked simultaneously with arrangement of cells, where FIGS. 22 and 23 are taken as an example, the mode is first changed over from the arrangement mode to the stacking mode by way of the inputting section 13, and then cells of the items a to c of the cell list 11B are arranged in order on the arrangement map 11A as shown in FIG. 23. In this instance, simultaneously when the cells are arranged, arrangement configuration data are stacked as a basic arrangement pattern.

In this instance, relative coordinates of the individual cells are set with reference to the origin defined by a cell arranged first in the stacking mode as seen in FIG. 24. In the example shown in FIGS. 23 and 24, the position of the cell a is set to the origin (0, 0); the position of the cell b is set to the coordinates (1, 0); and the position of the cell c is set to the coordinates (0, −1). Those position data are set in order as a basic arrangement pattern as seen in FIG. 25.

After the stacking of the basic arrangement pattern is completed, the mode will be changed over from the arrangement mode to the repetitive arrangement mode by way of the inputting section 13, and then a cell of the item d to be arranged subsequently is selected on the cell list 11B. Then, the cell d will be arranged at the position indicated by ① on the arrangement map 11A. Consequently, also cells of the items e and f are automatically arranged simultaneously with reference to the origin defined by the position ①. Similarly, if a cell of the item g is selected on the cell list 11B and the cell g is arranged at the position indicated by ② on the arrangement map 11A, then also cells of the items h and i are automatically arranged simultaneously with reference to the origin defined by the position ②.

On the other hand, according to the latter storage technique wherein a basic arrangement pattern is stacked making use of cells arranged already on the arrangement map 11A, if it is assumed that, for example, three cells a to c are arranged already on the arrangement map 11A as seen in FIG. 23, the mode will first be changed over from the arrangement mode into the stacking mode by way of the inputting section 13, and then the three cells a to c on the arrangement map 11A will be selected in order. When the cells are selected in this manner, a basic reference pattern is produced in a similar manner as in the former technique. Thereafter, the arrangement mode will be changed over to the repetitive arrangement mode, and arrangement of the cells is performed in a similar manner as described above.

It is to be noted that, when the cells a, b and c in FIG. 23 are selected in this order to produce a basic arrangement pattern, since the position data of the cell a registered first is defined as the origin (0, 0), the position data of the cells b and c are set relatively to (1, 0) and (0, −1), and those position data are stored as a basic arrangement pattern as seen in FIG. 25. Upon catalogue arrangement, the arrangement positions of the cells are calculated from the origin of the position data and the actual coordinates of the cells to be arranged. While the case wherein a basic arrangement pattern is constructed with three cells here, the present invention is not limited to such specific number or form.

In this manner, by inputting an instruction from the inputting section 13 and repetitively arranging a basic arrangement pattern on the arrangement map 11A by the function of the catalogue arrangement section 42, when it is necessary to arrange a plurality of cells in a same arrangement form at a plurality of locations, the designer can input an instruction of arrangement using the single basic arrangement pattern without arranging a plurality of cells one by one. This contributes very much to increase in speed of a circuit design.

By the way, when a cell is moved in order to improve a delay value at a stage wherein a logic design of a design object circuit is completed and then arrangement of cells and delay calculation at the logical length stage are completed, in the present embodiment, a path of a network influenced by the thus moved cell is automatically searched, and a delay is re-calculated by the delay calculation section 45 of the speed analysis section 16.

Making use of a result of the re-calculation, the speed analysis section 16 compares the delay obtained before such re-calculation with the delay obtained after such re-calculation and performs calculation of a delay time on the real time basis, and the delay value is displayed on the arrangement map 11A of the display section 11.

For example, when a path which interconnects four cells a to d is present as seen in FIG. 26(a), if the cell b is moved as seen in FIG. 26(b) by the cell movement section 39, a delay of such a new path which interconnects the four cells a to d is re-calculated after the movement of the cell b. It is to be noted that the delay value is actually varied at a portion indicated by a thick line in FIG. 26(b) by the movement of the cell b.

Since the layout designing section 15 and the speed analysis section 16 cooperate with each other in this manner, if mounting arrangement or wiring is performed, then it can be evaluated immediately by a speed analysis, and consequently, the turn-around time is reduced. This contributes to increase in speed of a circuit design of an LSI, a printed circuit board and so forth.

It is to be noted that, at an intermediate stage wherein mounting arrangement of cells is being performed by the layout designing section 15 after completion of a logic design of a design object circuit, not only arrangement data till then are stored into the data base 10, but also, in the present embodiment, the arrangement data can be written, by inputting an instruction from the inputting section 13, in a text form into the external file 18A by the external file writing section 18. Consequently, the arrangement data can be stored or saved into an external file.

In this instance, at a point of time when a command to save arrangement data is inputted from the inputting section 13, latest arrangement data present on the main storage apparatus (data base 10) is extracted, and the types of cells, the arrangement positions of cells, indices and so forth of the latest arrangement information are stored in a text form into the designated external file 18A. Consequently, when an emergency such as a trouble of a program occurs, the arrangement data can be restored readily.

g. Displaying Condition upon Speed Analysis

Here, the displaying condition (operation of the speed analysis section 16) upon speed analysis performed at step S9 of FIG. 7 or at step S19 of FIG. 8 will be described with reference to FIGS. 27 and 28.

FIG. 27 illustrates a displaying operation upon speed analysis. As seen in FIG. 27, when a speed analysis is executed by the layout designing section 15, if a pin (terminal) of a cell is designated on the arrangement map 11A (①) by an instruction from the inputting section 13, then a wiring path connected to the designated pin is traced from the designated pin by the path tracing section 46.

Then, a result of a delay calculation (result of a calculation by the delay calculation section 45) of the thus traced wiring path is displayed as a path delay list on the arrangement map 11A (②) under the control of the path delay display control section 47. Consequently, only by operating the inputting section 13 to designate a pin of a cell, the designer can observe and confirm a result of a delay calculation of a wiring path regarding the designated pin on the display section 11.

In this instance, if the designer operates the inputting section 13 to designate a wiring path on the path delay list displayed on the arrangement map 11A (②), then a route map of the wiring path is displayed on the arrangement map 11A (③) under the control of the route map display control section 48. Accordingly, the designer can observe the route map and confirm not only the route of the designated wiring path but also delays and waveforms at individual pins on the designated wiring path.

A more detailed example of a display of a route map is shown in FIG. 28. In the speed analysis section 16 in the present embodiment, in order to find out a critical path (path which exhibits the slowest signal propagation), the path tracing section 46 can perform forward tracing and backward tracing from an arbitrary pin, and a path delay list from a source pin to a target pin is displayed under the control of the path delay display control section 47. Then, a route map of the path selected on the path delay list including transition in signal waveform, a wiring line length of the network, delays of gates and/or networks, an accumulated delay from the source pin and fan-in/fan-out numbers is displayed as seen in FIG. 28.

Consequently, the designer can visually specify the critical path and so forth and can immediately determine visually definitely the delay of which network or which gate should be improved.

Further, if the designer operates the inputting section 13 to designate a gate or a network on the route map displayed on the arrangement map 11A (③), a mounting arrangement condition and a wiring condition (wiring data) of the gate or network are emphatically displayed on the arrangement map 11A (④) under the control of the mounting data display control section 49. Consequently, the designer can immediately recognize at which location on the arrangement map 11A (④) mounting data of the designated data or network (noticed path) are present.

h. Wiring Line Parasitic Capacitance Coding Technique and Displaying Condition of a Result of Coding Here, a wiring line parasitic capacitance coding technique and a displaying condition of a result of such coding, that is, operation of the wiring line parasitic capacitance map display control section 19, will be described with reference to FIGS. 6 and 29.

As described hereinabove with reference to FIG. 6, in the present embodiment, a result of arrangement and a result of wiring by the layout designing section 15 are read out from the data base 10 by the wiring line parasitic capacitance coding section 54 and checked up with a coding condition of the coding condition data base 53 to encode wiring line parasitic capacitances on a design object circuit. The code information is stored once into the information retrieval section 40 from the wiring line parasitic capacitance coding section 54.

Then, when the designer inputs an instruction from the inputting section 13 to make a request for display of a wiring line parasitic capacitance map, the wiring line parasitic capacitance code display control 55 is activated by way of the display acceptance section 56.

The wiring line parasitic capacitance code display control 55 thus extracts code information of the wiring line parasitic capacitances at individual points on the arrangement map 11A representing the current layout information from the data base 10 and controls the display section 11 so that graphic patterns or characters corresponding to the codes at the points, symbols, a color of the background and so forth are displayed in a map in a superimposed relationship around the points together with the layout information.

The display of the wiring line parasitic capacitance map is independent of operation of a wiring design and so forth and does not have an influence on a wiring design operation. Consequently, the designer can perform such ordinary operations as wiring, movement of a cell, deletion of a cell or movement of a cell while observing the capacitance code map.

Figure 29:
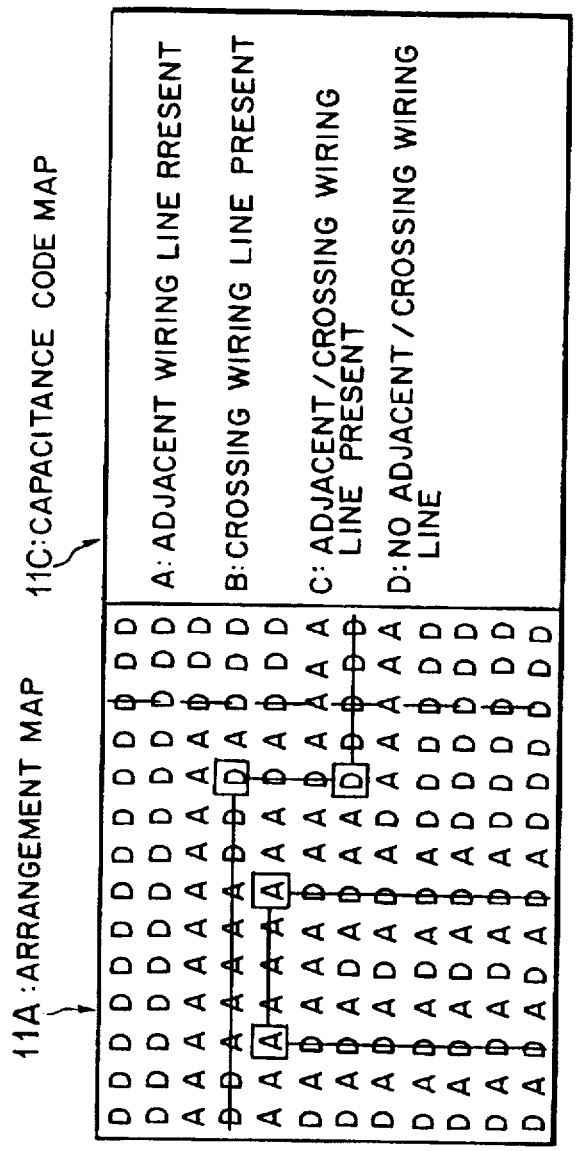
FIG. 29 is a diagrammatic view showing an example of a display of a result of coding of wiring line parasitic capacitances on an arrangement map.
Figure 30:
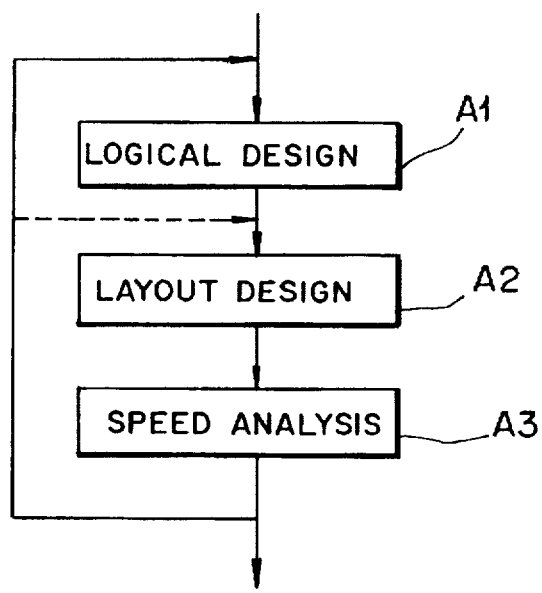
FIG. 30 is a flow chart illustrating a flow of process in g of a conventional interactive circuit design.

Here, an example of a display of a result of coding of wiring line parasitic capacitances on an arrangement map is shown in detail in FIG. 29. Referring to FIG. 29, the arrangement map on which a wiring line parasitic capacitance map is superimposed is denoted at 11A, and a capacitance code map which indicates data for interpretation of pieces of code information displayed on the display section 11 and indicating wiring line parasitic capacitances is denoted at 11C.

In the example shown in FIG. 29, pieces of code information regarding wiring line parasitic capacitances of A to D are superimposed at individual points on the arrangement map 11A, and concrete contents of the pieces of code information A to D are displayed on the capacitance code map 11C. For example, the code information A represents that, at the position, the wiring line is is positioned adjacent another wiring line; the code information B represents that, at the position, the wiring line crosses with another wiring line; the code information C represents that, at the position, the wiring line is positioned adjacent another wiring line and crosses with a different wiring line in another layer; and the code information D represents that, at the position, the wiring line is not influenced by any other wiring line.

Since the code information regarding the wiring line parasitic capacitance is displayed in a superimposed relationship on the arrangement map 11A of the design object circuit on the display section 11 under the control of the wiring line parasitic capacitance code display control 55 in this manner, the designer can observe, upon wiring processing, the code information of the wiring line parasitic capacitance displayed in a superimposed relationship on the arrangement map 11A to perceive the wiring line parasitic capacitances. Consequently, the designer can efficiently perform high speed wiring processing of a wiring line which exhibits a low signal propagation speed.

In this manner, with the interactive circuit designing apparatus of the preferred embodiment of the present invention, since the logical designing section 14, the layout designing section 15 and the speed analysis section 16 can cooperate with each other in a single system to execute designing of a circuit, the turn-around time can be reduced to raise the speed in designing of a circuit such as an LSI or a printed circuit board remarkably.

The present invention is not limited to the specifically described embodiment, and variations and modifications may be made without departing from the scope of the present invention.

What is claimed is:

1. An interactive circuit designing apparatus, comprising:
   a display section for displaying a process of a circuit design to allow a circuit design to be performed interactively;
   an inputting section for inputting response information to display data displayed on said display section;
   logical designing means for logically designing a design object circuit;
   layout designing means for performing a mounting arrangement of logical components constituting the design object circuit based on a result of the logical design by said logical designing means and performing a wiring between the logical components;
   speed analysis means for performing a speed analysis based on a calculation of a delay for each of a plurality of paths on the design object circuit in accordance with a result of the design by said layout designing means; and
   a grouping section for grouping, after a plurality of logical components to which a predetermined signal is to be distributed are arranged for mounting by said layout designing means, the plurality of logical components for last stage temporary positions of a signal distribution circuit for distributing the signal, and wherein said logical designing means includes a logic circuit addition section for generating a signal distribution circuit for distributing a signal from a signal source to the individual logical components based on the last state temporary positions and the plurality of logical component groups obtained by grouping by said grouping section and adding the signal distribution circuit as a logic circuit, said layout designing means determining a mounting arrangement of the signal distribution circuit based on the logic circuit as the signal distribution circuit added by said logic circuit addition section;
   said logical designing means, said layout designing means and said speed analysis means being connected to each other so as to cooperate with each other.

2. The interactive circuit designing apparatus as claimed in claim 1, wherein the last stage temporary positions and the plurality of logical component groups obtained by grouping by said grouping section are displayed on said display section.

3. The interactive circuit designing apparatus as claimed in claim 2, wherein estimated wiring line lengths from the last stage temporary positions to the individual logical components are displayed on said display section.

4. The interactive circuit designing apparatus as claimed in claim 3, further comprising a grouping variation acceptance section for accepting a request for variation of the grouping inputted from said inputting section in response to the display of said display section and requesting said grouping section for variation of the grouping.

5. The interactive circuit designing apparatus as claimed in claim 4, wherein the predetermined signal distributed to the logical components by said signal distribution circuit is a clock signal.

6. The interactive circuit designing apparatus as claimed in claim 4, wherein the predetermined signal distributed to the logical components by said signal distribution circuit is a reset signal.

7. The interactive circuit designing apparatus as claimed in claim 3, further comprising a signal distribution circuit last stage arrangement variation acceptance section for accepting a request for variation of the last stage temporary positions inputted from said inputting section in response to the display of said display section and developing a request for variation of the last stage temporary positions.

8. The interactive circuit designing apparatus as claimed in claim 7, wherein the predetermined signal distributed to the logical components by said signal distribution circuit is a clock signal.

9. The interactive circuit designing apparatus as claimed in claim 7, wherein the predetermined signal distributed to the logical components by said signal distribution circuit is a reset signal.

10. The interactive circuit designing apparatus as claimed in claim 3, further comprising a logical component arrangement variation acceptance section for accepting a request for variation of an arrangement position of a logical component inputted from said inputting section in response to the display of said display section and requesting said layout designing means for variation of the arrangement position of the logical component.

11. The interactive circuit designing apparatus as claimed in claim 10, wherein the predetermined signal distributed to the logical components by said signal distribution circuit is a clock signal.

12. The interactive circuit designing apparatus as claimed in claim 10, wherein the predetermined signal distributed to the logical components by said signal distribution circuit is a reset signal.

13. The interactive circuit designing apparatus as claimed in claim 3, wherein the predetermined signal distributed to the logical components by said signal distribution circuit is a clock signal.

14. The interactive circuit designing apparatus as claimed in claim 3, wherein the predetermined signal distributed to the logical components by said signal distribution circuit is a reset signal.

15. The interactive circuit designing apparatus as claimed in claim 2, further comprising a grouping variation acceptance section for accepting a request for variation of the grouping inputted from said inputting section in response to the display of said display section and requesting said grouping section for variation of the grouping.

16. The interactive circuit designing apparatus as claimed in claim 15, wherein the predetermined signal distributed to the logical components by said signal distribution circuit is a clock signal.

17. The interactive circuit designing apparatus as claimed in claim 15, wherein the predetermined signal distributed to the logical components by said signal distribution circuit is a reset signal.

18. The interactive circuit designing apparatus as claimed in claim 2, further comprising a signal distribution circuit last stage arrangement variation acceptance section for accepting a request for variation of the last stage temporary positions inputted from said inputting section in response to the display of said display section and developing a request for variation of the last stage temporary positions.

19. The interactive circuit designing apparatus as claimed in claim 18, wherein the predetermined signal distributed to the logical components by said signal distribution circuit is a clock signal.

20. The interactive circuit designing apparatus as claimed in claim 18, wherein the predetermined signal distributed to the logical components by said signal distribution circuit is a reset signal.

21. The interactive circuit designing apparatus as claimed in claim 2, further comprising a logical component arrangement variation acceptance section for accepting a request for variation of an arrangement position of a logical component inputted from said inputting section in response to the display of said display section and requesting said layout designing means for variation of the arrangement position of the logical component.

22. The interactive circuit designing apparatus as claimed in claim 21, wherein the predetermined signal distributed to the logical components by said signal distribution circuit is a clock signal.

23. The interactive circuit designing apparatus as claimed in claim 21, wherein the predetermined signal distributed to the logical components by said signal distribution circuit is a reset signal.

24. The interactive circuit designing apparatus as claimed in claim 2, wherein the predetermined signal distributed to the logical components by said signal distribution circuit is a clock signal.

25. The interactive circuit designing apparatus as claimed in claim 2, wherein the predetermined signal distributed to the logical components by said signal distribution circuit is a reset signal.

26. The interactive circuit designing apparatus as claimed in claim 1, wherein the signal distribution circuit added by said logic circuit addition section is displayed on said display section.

27. The interactive circuit designing apparatus as claimed in claim 26, further comprising an additional circuit variation acceptance section for accepting a request for variation of the signal distribution circuit inputted from said inputting section in response to the display of said display section and requesting said logic circuit addition section for variation of the signal distribution circuit.

28. The interactive circuit designing apparatus as claimed in claim 27, wherein the predetermined signal distributed to the logical components by said signal distribution circuit is a clock signal.

29. The interactive circuit designing apparatus as claimed in claim 27, wherein the predetermined signal distributed to the logical components by said signal distribution circuit is a reset signal.

30. The interactive circuit designing apparatus as claimed in claim 26, wherein the predetermined signal distributed to the logical components by said signal distribution circuit is a clock signal.

31. The interactive circuit designing apparatus as claimed in claim 26, wherein the predetermined signal distributed to the logical components by said signal distribution circuit is a reset signal.

32. The interactive circuit designing apparatus as claimed in claim 1, wherein the predetermined signal distributed to the logical components by said signal distribution circuit is a clock signal.

33. The interactive circuit designing apparatus as claimed in claim 1, wherein the predetermined signal distributed to the logical components by said signal distribution circuit is a reset signal.

34. The interactive circuit designing apparatus as claimed in claim 1, wherein said logical designing means includes a construction information decision section for deciding, after a plurality of logical components to be diagnosed are arranged for mounting by said layout designing means, construction information of a diagnosis facilitation circuit for diagnosing the plurality of logical components based on a result of arrangement of the plurality of logical components, and said layout designing means performs mounting arrangement of the diagnosis facilitation circuit based on the construction information of the diagnosis facilitation circuit decided by said construction information decision section.

35. The interactive circuit designing apparatus as claimed in claim 34, wherein the construction information of the diagnosis facilitation circuit decided by said construction information decision section is displayed on said display section.

36. The interactive circuit designing apparatus as claimed in claim 35, further comprising a construction information variation acceptance section for accepting a request for variation of the construction information inputted from said inputting section in response to the display of said display section and requesting said construction information decision section for variation of the construction information.

37. The interactive circuit designing apparatus as claimed in claim 36, wherein said construction information decision section decides, where the diagnosis facilitation circuit is of the scan chain type, a connection order of the plurality of logical components as the construction information for constructing a scan chain.

38. The interactive circuit designing apparatus as claimed in claim 36, wherein said construction information decision section decides, where the diagnosis facilitation circuit is of the address scan type, addresses for scanning the logical components as the construction information.

39. The interactive circuit designing apparatus as claimed in claim 35, wherein said construction information decision section decides, where the diagnosis facilitation circuit is of the scan chain type, a connection order of the plurality of logical components as the construction information for constructing a scan chain.

40. The interactive circuit designing apparatus as claimed in claim 35, wherein said construction information decision section decides, where the diagnosis facilitation circuit is of the address scan type, addresses for scanning the logical components as the construction information.

41. The interactive circuit designing apparatus as claimed in claim 34, wherein said construction information decision section decides, where the diagnosis facilitation circuit is of the scan chain type, a connection order of the plurality of logical components as the construction information for constructing a scan chain.

42. The interactive circuit designing apparatus as claimed in claim 34, wherein said construction information decision section decides, where the diagnosis facilitation circuit is of the address scan type, addresses for scanning the logical components as the construction information.

43. The interactive circuit designing apparatus as claimed in claim 1, further comprising a temporary wiring line production section for imaginatively wiring, after a mounting arrangement of the logical components is decided by said layout designing means, the logical components, and a confusion degree calculation section for calculating a confusion degree of wiring lines on the design object circuit based on a result of the temporary wiring by said temporary wiring line production section, the confusion degree calculated by said confusion degree calculation section being displayed on said display section.

44. The interactive circuit designing apparatus as claimed in claim 43, wherein said confusion degree calculation section divides the design object circuit into a plurality of grating-like areas and calculates, for each wiring layer of the design object circuit, a ratio of the number of estimated used channels based on a result of the temporary wiring by said temporary wiring line production section to the number of usable channels in each of the gratings as the confusion degree.

45. The interactive circuit designing apparatus as claimed in claim 44, further comprising a logical component arrangement variation acceptance section for accepting a request for variation of the mounting arrangement of a logical component inputted from said inputting section in response to the display of said display section and requesting said layout designing means for variation of the mounting arrangement.

46. The interactive circuit designing apparatus as claimed in claim 44, wherein said confusion degree calculation section calculates, after mounting wiring of the logical components is decided by said layout designing means, the confusion degree based on a result of the mounting wiring, the confusion degree calculated by said confusion degree calculation section being displayed on said display section.

47. The interactive circuit designing apparatus as claimed in claim 43, wherein said confusion degree calculation section calculates the number of free channels at a coordinate of each wiring layer in the direction of a main wiring line as the confusion degree.

48. The interactive circuit designing apparatus as claimed in claim 47, further comprising a logical component arrangement variation acceptance section for accepting a request for variation of the mounting arrangement of a logical component inputted from said inputting section in response to the display of said display section and requesting said layout designing means for variation of the mounting arrangement.

49. The interactive circuit designing apparatus as claimed in claim 47, wherein said confusion degree calculation section calculates, after mounting wiring of the logical components is decided by said layout designing means, the confusion degree based on a result of the mounting wiring, the confusion degree calculated by said confusion degree calculation section being displayed on said display section.

50. The interactive circuit designing apparatus as claimed in claim 43, further comprising a logical component arrangement variation acceptance section for accepting a request for variation of the mounting arrangement of a logical component inputted from said inputting section in response to the display of said display section and requesting said layout designing means for variation of the mounting arrangement.

51. The interactive circuit designing apparatus as claimed in claim 43, wherein said confusion degree calculation section calculates, after mounting wiring of the logical components is decided by said layout designing means, the confusion degree based on a result of the mounting wiring, the confusion degree calculated by said confusion degree calculation section being displayed on said display section.

52. The interactive circuit designing apparatus as claimed in claim 1, wherein, when a mounting arrangement of the logical components is decided by said layout designing means, an arrangement map of the design object circuit on which the logical components are arranged and a logical component list of the logical components to be arranged on said arrangement map are displayed in response to an instruction from said inputting section on said display section.

53. The interactive circuit designing apparatus as claimed in claim 52, further comprising a logical component arrangement section for arranging on said arrangement map a logical component selected on said logical component list in response to an instruction from said inputting section.

54. The interactive circuit designing apparatus as claimed in claim 53, further comprising a logical component deletion section for deleting from said arrangement map a logical component selected on said logical component list or said arrangement map in response to an instruction from said inputting section.

55. The interactive circuit designing apparatus as claimed in claim 53, further comprising a logical component movement section for moving a logical component selected on said logical component list or said arrangement map to another position on said arrangement map in response to an instruction from said inputting section.

56. The interactive circuit designing apparatus as claimed in claim 53, further comprising an information retrieval section for searching individual information or connection information of a logical component selected on said logical component list or said arrangement map in response to an instruction from said inputting section and causing the individual information or connection information thus searched out to be displayed on said display section.

57. The interactive circuit designing apparatus as claimed in claim 56, wherein a connection information list between a selected logical component and all logical components connected to the selected logical component is displayed as the connection information.

58. The interactive circuit designing apparatus as claimed in claim 57, wherein the connection information list includes logical lengths between the selected logical component and all logical components connected to the selected logical component.

59. The interactive circuit designing apparatus as claimed in claim 58, wherein, when any of the logical lengths violates a predetermined rule, the displaying condition of that portion of the connection information including the logical length which violates the rule is changed over into a visually identifiable condition on said connection information list.

60. The interactive circuit designing apparatus as claimed in claim 53, further comprising a catalogue arrangement section for storing a basic arrangement pattern for arranging a plurality of logical components in a same arrangement as a catalogue and repetitively arranging the basic arrangement pattern on said arrangement map in response to an instruction from said inputting section.

61. The interactive circuit designing apparatus as claimed in claim 60, wherein, when a plurality of logical components are arranged on said arrangement map by said logical component arrangement section, the logical components are simultaneously stored as the basic arrangement pattern.

62. The interactive circuit designing apparatus as claimed in claim 60, wherein a plurality of logical components selected on said arrangement map and arranged already are stored as the basic arrangement pattern in response to an instruction from said inputting section.

63. The interactive circuit designing apparatus as claimed in claim 1, further comprising an external file writing section for writing, during execution of mounting arrangement of the logical components by said layout designing means, data of the arrangement in a text form into an external file.

64. The interactive circuit designing apparatus as claimed in claim 1, wherein, immediately after mounting arrangement processing of the logical components by said layout designing means, a speed analysis by said speed analysis means is performed based on a temporary wiring line length between the logical components according to the mounting arrangement, and the mounting arrangement of the logical components is varied in response to a result of the speed analysis by said layout designing means.

65. The interactive circuit designing apparatus as claimed in claim 1, wherein, immediately after wiring processing of the logical components by said layout designing means, a speed analysis by said speed analysis means is performed based on an actual wiring line length by the wiring, and the wiring of the logical components is varied in response to a result of the speed analysis by said layout designing means.

66. The interactive circuit designing apparatus as claimed in claim 1, further comprising a path tracing section for tracing a wiring line path connected to a pin of a logical component designated by an instruction from said inputting section upon execution of a speed analysis by said speed analysis means from the pin, and a path delay display control section for controlling said display section to display thereon a result of a delay calculation of the wiring line path traced by said path tracing section as a path delay list.

67. The interactive circuit designing apparatus as claimed in claim 66, further comprising a route map display control section for controlling said display section to display thereon a route of a wiring line path designated on the path display list and delays and waveforms at pins on the wiring line path as a route map in response to an instruction from said inputting section.

68. The interactive circuit designing apparatus as claimed in claim 67, further comprising a mounting data display control section for controlling said display section to emphatically display thereon a mounting arrangement condition and a wiring condition of a gate or a network designated on the route map in response to an instruction from said inputting section.

69. The interactive circuit designing apparatus as claimed in claim 1, further comprising a wiring line parasitic capacitance coding section for coding, upon wiring processing between the logical components by said layout designing means, wiring line parasitic capacitances on the design object circuit according to an arrangement and a wiring scheme decided by said layout designing means at present, and a wiring line parasitic capacitance code display control section for controlling said display section to display thereon code information obtained by coding by said wiring line parasitic capacitance coding section in a superimposed relationship on the arrangement map of the design object circuit on said display section.

* * * * *